(12) United States Patent
Ma et al.

(10) Patent No.: US 12,543,288 B2
(45) Date of Patent: Feb. 3, 2026

(54) POWER DISTRIBUTION SUBRACK AND POWER DISTRIBUTION EQUIPMENT

(71) Applicant: Huawei Digital Power Technologies Co., Ltd., Shenzhen (CN)

(72) Inventors: Donghai Ma, Dongguan (CN); Zihao Li, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 249 days.

(21) Appl. No.: 18/394,245

(22) Filed: Dec. 22, 2023

(65) Prior Publication Data

US 2024/0130067 A1   Apr. 18, 2024

Related U.S. Application Data

(63) Continuation of application No. PCT/CN2021/103493, filed on Jun. 30, 2021.

(51) Int. Cl.
*H05K 7/14*     (2006.01)
*H02B 1/04*     (2006.01)

(52) U.S. Cl.
CPC ............ *H05K 7/1492* (2013.01); *H02B 1/04* (2013.01)

(58) Field of Classification Search
CPC ................................ H05K 7/1492; H02B 1/04
USPC ........................................................ 361/643
See application file for complete search history.

(56) References Cited

U.S. PATENT DOCUMENTS

| | | | | |
|---|---|---|---|---|
| 6,232,675 B1* | 5/2001 | Small | .................. | H01H 47/001 307/30 |
| 2002/0135964 A1* | 9/2002 | Murray | .............. | H01H 33/6661 361/131 |
| 2008/0084114 A1* | 4/2008 | Brucherseifer | ... | H02J 13/00016 307/38 |
| 2008/0084644 A1* | 4/2008 | King | ................. | H02J 13/00016 361/102 |
| 2009/0212975 A1* | 8/2009 | Ausman | ............ | G01R 31/3277 340/945 |
| 2012/0275359 A1* | 11/2012 | Knaggs | ............. | H04W 52/0203 455/67.11 |

(Continued)

FOREIGN PATENT DOCUMENTS

CN   111029223 A   *   4/2020   ............ H01H 73/14
WO   2021098183 A1   5/2021

*Primary Examiner* — Zhengfu J Feng
(74) *Attorney, Agent, or Firm* — Maier & Maier, PLLC

(57) ABSTRACT

A power distribution subrack and power distribution equipment, and is related to the field of circuit technologies. The power distribution subrack includes a subrack body and a collection board, the collection board is disposed inside the subrack body, and the collection board includes a plurality of connection terminals and a plurality of controllers. Second ends of at least two of the plurality of connection terminals are connected to a same controller. First ends of at least some of the plurality of connection terminals are plug-connected to jacks of one or more circuit breakers, and the at least some connection terminals are in a one-to-one correspondence with the one or more circuit breakers. Each of the at least some connection terminals obtains a status signal of a corresponding circuit breaker, and transmits the status signal to a corresponding controller.

17 Claims, 21 Drawing Sheets

(56) References Cited

U.S. PATENT DOCUMENTS

| | | | | |
|---|---|---|---|---|
| 2014/0320299 A1* | 10/2014 | Kirk | .................. | H01H 9/54 |
| | | | | 340/691.8 |
| 2020/0028352 A1* | 1/2020 | Strouse | ................ | H05K 7/1457 |
| 2020/0321772 A1* | 10/2020 | Groeger | ............. | H01H 33/6662 |
| 2022/0277914 A1 | 9/2022 | Yang et al. | | |

* cited by examiner

POWER DISTRIBUTION SUBRACK AND POWER DISTRIBUTION EQUIPMENT

CROSS-REFERENCE TO RELATED APPLICATIONS

This application is a continuation of International Application No. PCT/CN2021/103493, filed on Jun. 30, 2021, the disclosure of which is hereby incorporated by reference in its entirety.

TECHNICAL FIELD

The embodiments relate to the field of circuit technologies, and to a power distribution subrack and power distribution equipment.

BACKGROUND

A power distribution subrack may also be referred to as a power distribution box, and can be used in power distribution equipment of a base station or power distribution equipment of a data center. The power distribution subrack controls power-on and power-off of a load and a power supply by using a circuit breaker (CB).

When the circuit breaker is connected to the power distribution subrack, an edge connector on a collection board of the power distribution subrack is inserted into a jack at a corresponding location on the circuit breaker, to electrically connect the circuit breaker to the collection board. During actual application, circuit breakers with different specifications are selected based on a power or an operating current of a load and a power or an operating current of a power supply. The circuit breakers with different specifications have different widths. In addition, it is required that the circuit breakers with different widths may be mixedly plug-connected to the circuit breakers, and the collection board can control all the circuit breakers.

Refer to a top view of a power distribution subrack shown in FIG. 1. As shown in the figure, circuit breakers with widths of L1 and L2 are mixedly plug-connected on the power distribution subrack 1. The circuit breakers are CB1 to CB7 in sequence. L1 and L2 are different. For example, L1 is 30 millimeters (mm) and L2 is 20 mm. In this case, an edge connector on a collection board 100 is designed in a basic unit of 10 mm. In this case, three edge connectors correspondingly exist within the width of L1, and two edge connectors correspondingly exist within the width of L2. The edge connectors are GF1 to GF18 in sequence. Each circuit breaker is provided with one jack 201 for being plug-connected to one edge connector at a corresponding location. Each edge connector is correspondingly connected to one controller, and controllers are C1 to C18 in sequence. The controller is configured to: obtain a status signal of a circuit breaker transmitted by a corresponding edge connector, and send a control signal to the circuit breaker by using the edge connector, so that the circuit breaker is disconnected or connected. However, only one edge connector is plug-connected to one circuit breaker, in other words, one circuit breaker is controlled by one controller. Therefore, when the foregoing manner is used, the controllers are redundantly disposed, and many controllers are in an idle state, thereby wasting space of the collection board and increasing material costs of the collection board.

SUMMARY

The embodiments include a power distribution subrack and power distribution equipment to reduce space that is on a collection board and that is occupied by a control circuit, and reduce material costs of the collection board.

According to a first aspect, the embodiments provide a power distribution subrack, where the power distribution subrack is used in power distribution equipment, and the power distribution subrack controls power-on and power-off of a load and a power supply by using a circuit breaker. The power distribution subrack includes a subrack body and a collection board. The collection board is disposed inside the subrack body, and the collection board includes a plurality of connection terminals and a plurality of controllers. When the power distribution subrack is plug-connected to a circuit breaker, second ends of at least two of the plurality of connection terminals are connected to a same controller, first ends of at least some of the plurality of connection terminals are plug-connected to jacks of one or more circuit breakers, and the at least some connection terminals are in a one-to-one correspondence with the one or more circuit breakers, that is, each of the at least some connection terminals is plug-connected to a jack of one circuit breaker, and only one connection terminal is plug-connected to a jack of each circuit breaker. Each of the at least some connection terminals is configured to: obtain a status signal of a corresponding circuit breaker, and transmit the status signal to a corresponding controller. The controller sends, based on the status signal and by using the corresponding connection terminal, a control signal to the circuit breaker corresponding to the status signal, where the control signal is used to control connection and disconnection of the circuit breaker corresponding to the status signal.

Accordingly, in the solution provided in the embodiments, the second ends of the at least two connection terminals are connected to the same controller, so that a quantity of controllers disposed on the collection board is reduced while the power distribution subrack supports a mixed plug-connection of circuit breakers with different specifications, thereby reducing controllers in an idle state, increasing utilization of the controllers, further reducing space that is on the collection board and that is occupied by the controller, and reducing material costs of the collection board.

In a possible implementation, each connection terminal includes a plurality of pins, and the plurality of pins are configured to transmit different types of signals. The foregoing different types of signals include the control signal, and further include at least one of the following types of status signals: a circuit breaker in-position signal, a voltage sampling signal, a current sampling signal, a temperature sampling signal, or an indicator status signal of a circuit breaker. In the at least two connection terminals connected to the same controller, pins located in each connection terminal and configured to transmit a same type of signals are connected.

The circuit breaker in-position signal represents whether the circuit breaker is currently in position. For example, the in-position signal is a level signal, and when the circuit breaker is in position, the in-position signal is at a high level; or when the circuit breaker is not in position, the in-position signal is at a low level. The voltage sampling signal of the circuit breaker represents a voltage of a circuit connected to the circuit breaker in a current state, and can be obtained by a voltage sensor inside the circuit breaker. The current sampling signal of the circuit breaker represents a current flowing through the circuit breaker currently, and can be obtained by a current sensor inside the circuit breaker. The temperature sampling signal of the circuit breaker represents a current temperature of a circuit inside the circuit breaker, and can be obtained by a temperature sensor inside the circuit breaker. The indicator status signal of the circuit breaker represents connection and disconnection of a circuit on which an indicator of the circuit breaker is located. The controller monitors the circuit breaker by obtaining the status signal of the corresponding circuit breaker.

When a first end of any connection terminal is plug-connected to a jack of a circuit breaker, the circuit breaker may communicate with a corresponding controller, to ensure that the controller obtains a status signal of the corresponding circuit breaker and that the controller sends a control signal to the corresponding circuit breaker.

In a possible implementation, the connection terminal is either an edge connector or a connector of an interconnection wiring terminal. When the connection terminal is the connector of the interconnection wiring terminal, the jack that is of the circuit breaker and that is for being plug-connected on the power distribution subrack is a socket of the interconnection wiring terminal, and the socket of the interconnection wiring terminal has space for accommodating a connector of the interconnection wiring terminal.

In a possible implementation, the plurality of connection terminals include a plurality of groups of connection terminals, each of the plurality of groups of connection terminals includes at least two connection terminals, and second ends of the at least two connection terminals included in each of the plurality of groups of connection terminals are connected to a same controller.

In a possible implementation, each of the plurality of groups of connection terminals includes two connection terminals. In this case, second ends of every two connection terminals are correspondingly connected to one controller, that is, every two connection terminals share one controller. When the power distribution subrack is used to distribute power to a power supply or a load device with a relatively small operating current, the power distribution subrack is plug-connected to only a circuit breaker with a width of 20 mm, so that starting all the controllers is ensured, the quantity of controllers is reduced to half of that in the conventional technology, material costs of the collection board are reduced, and practicability of the power distribution subrack is improved. In addition, the power distribution subrack further supports a mixed plug-connection between a circuit breaker with a width of 30 mm and the circuit breaker with the width of 20 mm, that is, distributes power to both a power supply or a load device with a relatively small operating current and a power supply or a device with a relatively large operating current. In addition, circuit breakers may be tightly plug-connected on the power distribution subrack, so that a width of the collection board is fully utilized, and practicability of the power distribution subrack is improved.

In a possible implementation, each of the plurality of groups of connection terminals includes three connection terminals. In this case, second ends of every three connection terminals are correspondingly connected to one controller, that is, every three connection terminals share one controller. When the power distribution subrack is used to distribute power to a device with a relatively large power and operating current, the power distribution subrack may be plug-connected to only a circuit breaker with a width of 30 mm, so that starting all the controllers is ensured, the quantity of disposed controllers is reduced to one-third of that in the conventional technology, material costs of the collection board are reduced, and practicability of the power distribution subrack is improved. In addition, the power distribution subrack further supports a mixed plug-connection of a circuit breaker with a width of 30 mm and a circuit breaker with a width of 20 mm, that is, distributes power to both a device with a relatively small power and operating current and a device with a relatively large power and operating current. In this way, practicability of the power distribution subrack is improved.

In a possible implementation, each of the plurality of groups of connection terminals includes four connection terminals. In this case, second ends of every four connection terminals are correspondingly connected to one controller, that is, every four connection terminals share one controller. In this case, when the power distribution subrack is used to distribute power to a device with a relatively large power and operating current, the quantity of controllers on the collection board may be reduced to a quarter of that in the conventional technology, utilization of the controller is increased, and material costs of the collection board are reduced. In addition, the power distribution subrack further supports a mixed plug-connection of a circuit breaker with a width of 30 mm and a circuit breaker with a width of 20 mm, that is, distributes power to both a device with a relatively small power and operating current and a device with a relatively large power and operating current. In this way, practicability of the power distribution subrack is improved.

In a possible implementation, the collection board includes at least one first area, and among a plurality of connection terminals distributed in the at least one first area, second ends of every M connection terminals are connected to a same controller. M is an integer greater than or equal to 2. Division is performed to obtain the first area, so that a circuit breaker can be tightly plug-connected when the circuit breaker is plug-connected in the first area, space of the collection board in the first area is fully utilized, a plug-connection operation is standardized, and practicability of the power distribution subrack is improved.

In a possible implementation, the collection board further includes at least one second area, and among a plurality of connection terminals distributed in the at least one second area, second ends of every N connection terminals are connected to a same controller. N is an integer greater than or equal to 2, and M is unequal to N. Division is performed to obtain the second area, so that a circuit breaker can be tightly plug-connected when the circuit breaker is plug-connected in the second area, space of the collection board in the second area is fully utilized, a plug-connection operation is standardized, and practicability of the power distribution subrack is improved.

In a possible implementation, at least some connection terminals in the at least one first area are configured to be plug-connected to at least one first circuit breaker, and at least some connection terminals in the at least one second area are configured to be plug-connected to at least one second circuit breaker. The first circuit breaker and the second circuit breaker have different specifications, that is, have different widths and different operating currents. In this case, the power distribution subrack may distribute power to power supplies with different operating currents or load devices with different operating currents.

The load device includes, but is not limited to, a fan, an air conditioner, a remote radio unit (RRU), a baseband processing unit (BBU), or the like.

In a possible implementation, the collection board includes at least one first area and at least one second area. M=3 and N=2. At least some connection terminals in the at least one first area are configured to be plug-connected to the first circuit breaker, and a width of the first circuit breaker is 30 mm, to distribute power to a load device or a power supply with a relatively large operating current. At least some connection terminals in the at least one second area are configured to be plug-connected to the second circuit breaker, and a width of the second circuit breaker is 20 mm, to distribute power to a load device or a power supply with a relatively large operating current.

The collection board of the power distribution subrack is divided into different areas to be plug-connected to circuit breakers with different widths. When the circuit breakers are to be plug-connected, the circuit breakers can be tightly arranged, so that space of the collection board can be fully utilized, and a user may plug-connect the circuit breaker to a corresponding area based on a correspondence between an area and a width of a circuit breaker, thereby standardizing a plug-connection operation and improving practicability of the power distribution subrack.

In a possible implementation, the collection board includes at least one first area and at least one second area. M=4 and N=2. At least some connection terminals in the at least one first area are configured to be plug-connected to the first circuit breaker, and a width of the first circuit breaker is 30 mm or 40 mm, to distribute power to a load device or a power supply with a relatively large operating current. At least some connection terminals in the at least one second area are configured to be plug-connected to the second circuit breaker, and a width of the second circuit breaker is 20 mm, to distribute power to a load device or a power supply with a relatively large operating current.

The collection board of the power distribution subrack is divided into different areas to be plug-connected to circuit breakers with different widths. When a circuit breaker is to be plug-connected, a user may plug-connect the circuit breaker to a corresponding area based on a correspondence between an area and a width of a circuit breaker, thereby standardizing a plug-connection operation and improving practicability of the power distribution subrack.

In a possible implementation, the collection board includes at least one first area and at least one second area. M=4 and N=3. At least some connection terminals in the at least one first area are configured to be plug-connected to the first circuit breaker, and a width of the first circuit breaker is 40 mm. At least some connection terminals in the at least one second area are configured to be plug-connected to the second circuit breaker, and a width of the second circuit breaker is 30 mm.

The collection board of the power distribution subrack is divided into different areas to be plug-connected to circuit breakers with different widths. When a circuit breaker is to be plug-connected, a user may plug-connect the circuit breaker to a corresponding area based on a correspondence between an area and a width of a circuit breaker, thereby standardizing a plug-connection operation and improving practicability of the power distribution subrack. In a possible implementation, to protect the controller, a resistor may further be disposed to limit a current, and to divide a voltage of a pin. In this case, a plurality of first resistors are further disposed on the collection board. A second end of each connection terminal is connected to the controller by using at least one first resistor.

In this case, regardless of which connection terminal is plug-connected to the jack of the circuit breaker, at least one first resistor is included on a connection line between any pin for signal transmission and the controller, thereby implementing protection on the controller.

In a possible implementation, the collection board further includes a plurality of second resistors. After second ends of at least every two connection terminals are connected, the second ends are connected to one controller by using at least one second resistor.

In this case, regardless of which connection terminal is plug-connected to the jack of the circuit breaker, at least one second resistor is included on a connection line between any pin for signal transmission and the controller, thereby implementing protection on the controller.

Only one of or both the foregoing first resistor and the foregoing second resistor may be disposed.

According to a second aspect, the embodiments include power distribution equipment. The power distribution equipment may be used in a power supply of a base station, for example, power distribution equipment of a 5G base station. In some embodiments, the power distribution equipment is an intelligent power supply, and is configured to: distribute power to and monitor various types of load devices. The power distribution equipment includes at least one power distribution subrack provided in the foregoing implementation, and further includes at least one circuit breaker. The power distribution equipment controls power-on or power-off of a load device and a power supply by using the circuit breaker. The circuit breaker is plug-connected on the power distribution subrack.

The circuit breaker on the power distribution subrack of the power distribution equipment enables at least two connection terminals to share one controller, so that a quantity of controllers disposed on the collection board is reduced, thereby reducing controllers in an idle state, increasing utilization of the controllers, further reducing space that is on the collection board and that is occupied by the controller, and reducing material costs of the collection board.

In a possible implementation, the foregoing power distribution equipment includes at least two circuit breakers, the at least two circuit breakers include at least one first circuit breaker and at least one second circuit breaker, and an operating current of a power supply or a load device connected to the at least one first circuit breaker is greater than an operating current of a power supply or a load device connected to the at least one second circuit breaker. That is, the first circuit breaker and the second circuit breaker have different widths and different operating currents. In this case, the power distribution subrack of the power distribution equipment supports a mixed plug-connection of circuit breakers with different specifications, to distribute power to load devices or power supplies with different operating currents, thereby improving practicability and convenience.

DETAILED DESCRIPTION OF EMBODIMENTS

In order for a person skilled in the art to better understand solutions provided in embodiments, an application scenario of the solutions of the embodiments is first described below.

A power distribution subrack may also be referred to as a power distribution box, and may be used in power distribution equipment of a power supply of a base station, for example, power distribution equipment of a 5th generation mobile communication technology (5G) base station. In some embodiments, the power distribution equipment is an intelligent power supply, and is configured to: distribute power to and monitor various types of load devices. The power distribution subrack controls power-on and power-off of a load and a power supply by using a circuit breaker. The circuit breaker is a switch apparatus that can make, bear, and break a current in a normal operating state, and can make, bear, and break a current in an abnormal operating state within a specified time.

Figure 1:
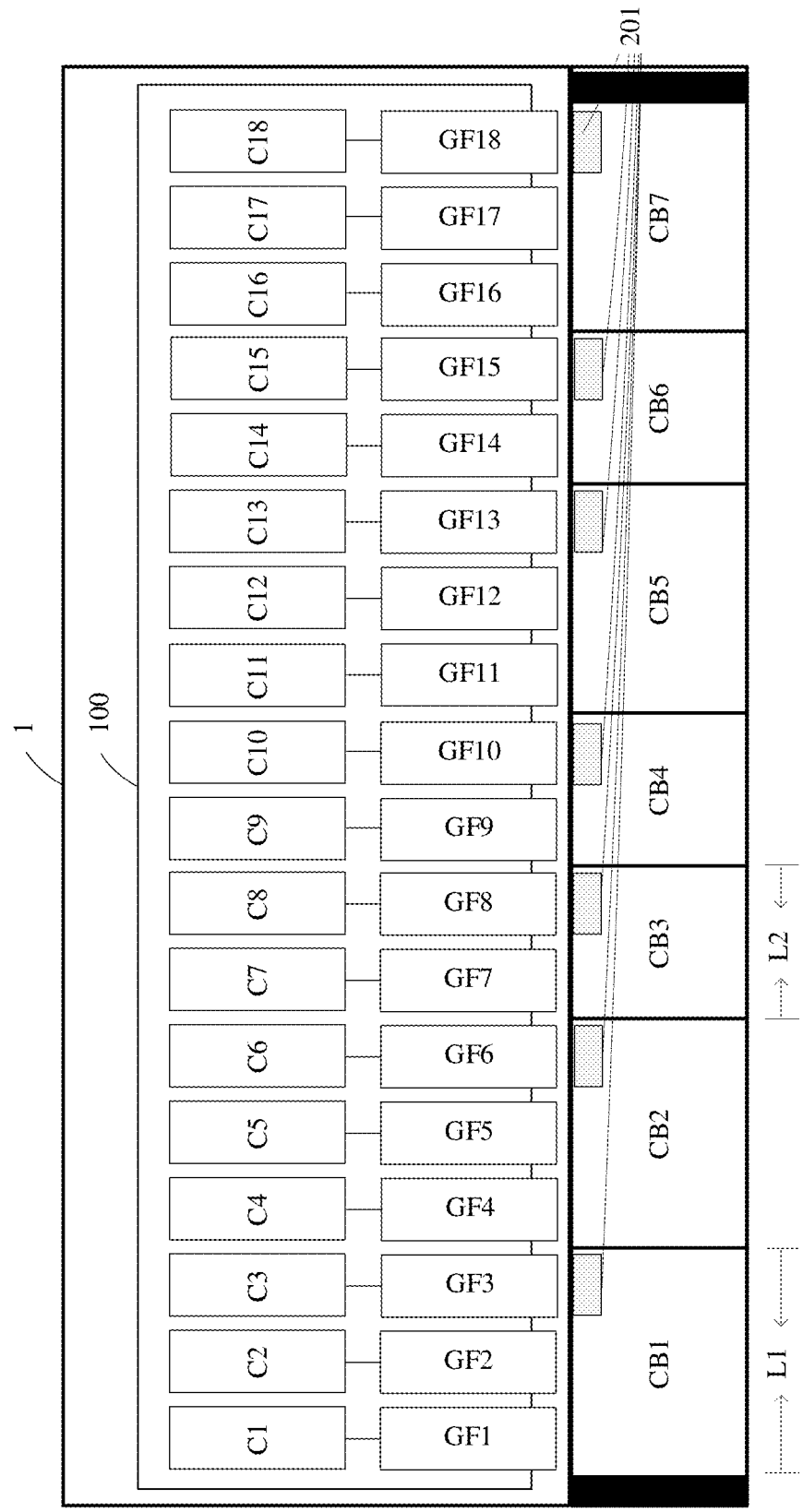
FIG. 1 is a top view of an existing power distribution subrack.

Continue to refer to FIG. 1. Regularly arranged edge connectors GF1 to GF18 are disposed on a collection board 100. One edge connector generally includes a plurality of conductive contact plates in golden yellow, and each conductive contact plate is referred to as a pin (Pin) because a surface of the conductive contact plate is golden yellow. The plurality of conductive contact plates are arranged in a finger shape, and therefore are referred to as edge connectors. The edge connector on the collection board 100 is configured to be plug-connected to a jack at a corresponding location of a circuit breaker.

Currently, typical circuit breakers have widths of 30 mm and 20 mm, and an operating current of a circuit breaker with the width of 30 mm is greater than an operating current of a circuit breaker with the width of 20 mm. The power distribution subrack may determine a width of a to-be-plug-connected circuit breaker based on an operating current of a connected load device or power supply.

To enable the power distribution subrack to support a mixed plug-connection of all circuit breakers with different widths, currently, one edge connector is disposed within a width of 10 mm on the collection board 100, and a width of the edge connector is less than 10 mm. A specific width of one edge connector is not limited in this embodiment. In this case, three edge connectors correspondingly exist on a 30 mm collection board, and two edge connectors correspondingly exist on a 20 mm collection board. Each edge connector is correspondingly connected to one controller. In other words, the edge connector GF1 is connected to a controller C1, the edge connector GF2 is connected to a controller C2, . . . , and by analogy, until the edge connector GF18 is connected to a controller C18.

Each circuit breaker is provided with one jack 201 for being plug-connected to one edge connector at a corresponding location. In the power distribution subrack shown in FIG. 1, the edge connector GF3 is plug-connected to a jack of a circuit breaker CB1, the edge connector GF6 is plug-connected to a jack of a circuit breaker CB2, the edge connector GF8 is plug-connected to a jack of a circuit breaker CB3, the edge connector GF10 is plug-connected to a jack of a circuit breaker CB4, the edge connector GF13 is plug-connected to a jack of a circuit breaker CB5, the edge connector GF15 is plug-connected to a jack of a circuit breaker CB6, the edge connector GF18 is plug-connected to a jack of a circuit breaker CB7, and remaining edge connectors are suspended.

Because only one edge connector is plug-connected to a jack of one circuit breaker, and each edge connector is connected to one controller, one circuit breaker is controlled by one controller. In the power distribution subrack shown in FIG. 1, only seven controllers are started, and the remaining 11 controllers are idle. Therefore, such a design wastes space of the collection board and increases material costs of the collection board.

In FIG. 1, an example in which seven circuit breakers are inserted into the power distribution subrack and 18 edge connectors are included is used. This is merely for ease of description, and does not constitute a limitation on the power distribution subrack. The power distribution subrack may alternatively support insertion of other different quantities of circuit breakers, and the collection board of the power distribution subrack may alternatively include different quantities of edge connectors.

To resolve the foregoing problem, the embodiments include a power distribution subrack and power distribution equipment. The collection board includes a plurality of connection terminals (that is, the foregoing edge connectors) and a plurality of controllers. Second ends of at least two of the plurality of connection terminals are connected to a same controller. First ends of at least some of the plurality of connection terminals are plug-connected to jacks of one or more circuit breakers, and the at least some connection terminals are in a one-to-one correspondence with the one or more circuit breakers. Each of the at least some connection terminals is configured to: obtain a status signal of a corresponding circuit breaker, and transmit the status signal to a corresponding controller. The controller sends, based on the status signal and by using the corresponding connection terminal, a control signal to the circuit breaker corresponding to the status signal, and the control signal is used to control connection and disconnection of the circuit breaker corresponding to the status signal. In the solution, at least two connection terminals share one controller, thereby reducing a quantity of controllers disposed on the collection board, reducing space that is on the collection board and that is occupied by the controller, and reducing material costs of the collection board.

The following describes the solutions provided in the embodiments with reference to the accompanying drawings.

Terms "first", "second", and the like in the following embodiments are used for descriptive purposes only and should not be construed to indicate or imply relative importance or implicitly point out a quantity of indicated features.

In the following embodiments, unless otherwise expressly specified and limited, a term "connection" should be understood in a broad sense. For example, the connection may be a fastened connection, a detachable connection, or an integral connection, or may be a direct connection or an indirect connection based on an intermediate medium.

An embodiment provides a power distribution subrack. A specific application scenario includes, but is not limited to, power distribution equipment of a base station, for example, an intelligent power supply. The following provides descriptions with reference to the accompanying drawings.

Figure 2:
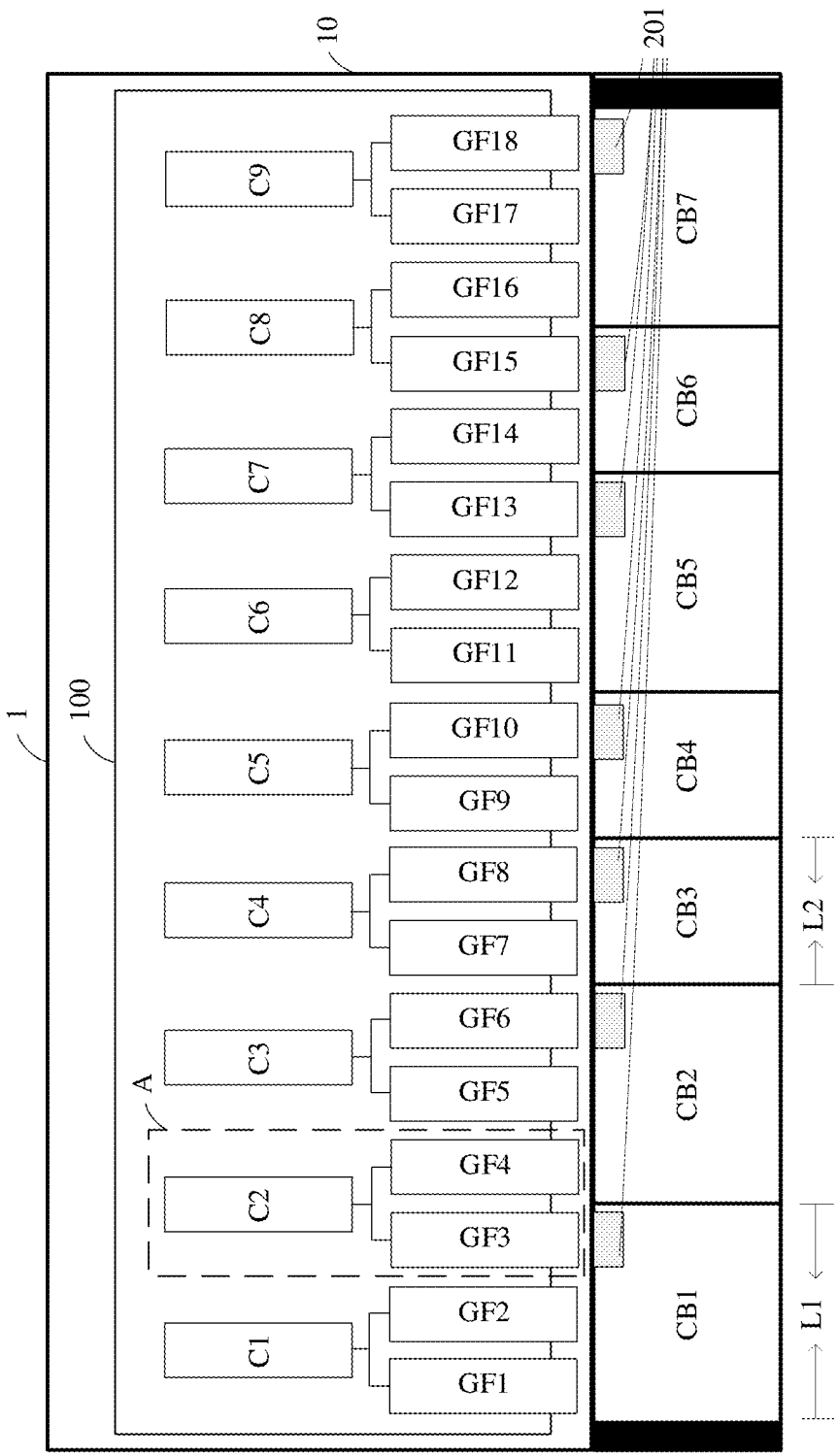
FIG. 2 is a top view of a power distribution subrack according to an embodiment.

FIG. 2 is a schematic diagram of a power distribution subrack according to an embodiment.

The power distribution subrack 1 shown in the figure includes a subrack body 10 and a collection board 100. The collection board 100 is disposed inside the subrack body 10 and the collection board 100 includes a plurality of connection terminals (a GF1 to a GF18) and a plurality of controllers (a C1 to a C9).

Second ends of at least two of the plurality of connection terminals are connected to a same controller, first ends of at least some of the plurality of connection terminals are plug-connected to jacks of one or more circuit breakers, the at least some connection terminals are in a one-to-one correspondence with the plurality of circuit breakers, and only one connection terminal is plug-connected to a jack of one circuit breaker.

In FIG. 2, an example in which second ends of every two connection terminals are correspondingly connected to one controller, that is, every two connection terminals share one controller is used.

The connection terminal shown in FIG. 2 is designed in a basic unit of 10 mm For example, one connection terminal is disposed within a width of 10 mm, and a width of the connection terminal is less than 10 mm. A specific width of the connection terminal is not limited in this embodiment.

As shown in FIG. 2, second ends of the GF1 and the GF2 are connected and correspond to the C1; second ends of the GF3 and the GF4 are connected and correspond to the C2; second ends of the GF5 and the GF6 are connected and correspond to the C3; second ends of the GF7 and the GF8 are connected and correspond to the C4; second ends of the GF9 and the GF10 are connected and correspond to the C5; second ends of the GF11 and the GF12 are connected and correspond to the C6; second ends of the GF13 and the GF14 are connected and correspond to the C7; second ends of the GF15 and the GF16 are connected and correspond to the C8; and second ends of the GF17 and the GF18 are connected and correspond to the C9.

When a circuit breaker is plug-connected on the power distribution subrack, some connection terminals are inserted into jacks 201 of circuit breakers, the connection terminal obtains a status signal of the circuit breaker plug-connected to the connection terminal, and transmits the status signal to a controller connected to the connection terminal. The controller monitors an operating state of the circuit breaker based on the status signal, and the controller may further send a control signal to the corresponding circuit breaker by using the connection terminal, to control connection or disconnection of the circuit breaker.

A type of the connection terminal is not limited in this embodiment. For example, the connection terminal may be an edge connector or a connector of an interconnection wiring terminal. When the connection terminal is implemented as an edge connector, the jack of the circuit breaker is a slot-shaped jack, and the edge connector is inserted into the slot-shaped jack of the circuit breaker when being plug-connected to the circuit breaker. When the connection terminal is implemented as a connector of the interconnection wiring terminal, the jack of the circuit breaker is a socket of the interconnection wiring terminal, the socket of the interconnection wiring terminal has space for accommodating a connector of the interconnection wiring terminal.

An example in which the connection terminal is an edge connector is used below for description. The collection board 100 shown in the figure includes the edge connectors GF1 to GF18.

The collection board 100 shown in FIG. 2 includes the controllers C1 to C9, and an implementation used when two edge connectors share one controller is shown. A principle used when three or more edge connectors share one controller is similar.

An arrangement sequence of circuit breakers shown in FIG. 2 is the same as that in FIG. 1. Because only one edge connector is plug-connected to a jack of one circuit breaker, in this case, the GF3 is plug-connected to a jack of the CB1, and the CB1 is controlled by the controller C2; the GF6 is plug-connected to a jack of the CB2, and the CB2 is controlled by the controller C3; the GF8 is plug-connected to a jack of the CB3, and the CB3 is controlled by the controller C4; the GF10 is plug-connected to a jack of the CB4, and the CB4 is controlled by the controller C5; the GF13 is plug-connected to a jack of the CB5, and the CB5 is controlled by the controller C7; the GF15 is plug-connected to a jack of the CB6, and the CB6 is controlled by the controller C8; and the GF18 is plug-connected to a jack of the CB7, and the CB7 is controlled by the controller C9.

Among the nine controllers shown in FIG. 2, seven controllers are started, and the remaining two controllers are idle. In comparison with the solution in which only seven of the 18 controllers shown in FIG. 1 are started and the remaining 11 controllers are idle, it can be understood that when the solution provided in this embodiment used, controllers in an idle state are reduced, and utilization of the controllers is increased. In addition, a quantity of controllers disposed on the collection board is reduced, space that is on the collection board and that is occupied by the controller is reduced, and material costs of the collection board are reduced.

Each of the foregoing controllers may be an application-specific integrated circuit (ASIC), a programmable logic device (PLD), a digital signal processor (DSP), or a combination thereof. The PLD may be a complex programmable logic device (CPLD), a field programmable gate array (FPGA), generic array logic (GAL), or any combination thereof. This is not limited in this embodiment.

The following provides descriptions with reference to an implementation of the power distribution subrack. In the following descriptions, an example in which the connection terminal is an edge connector is used. A principle used when the connection terminal is a connector of an interconnection wiring terminal is similar, and details are no longer described one by one.

The following first describes a connection manner of the edge connector.

Figure 3A:
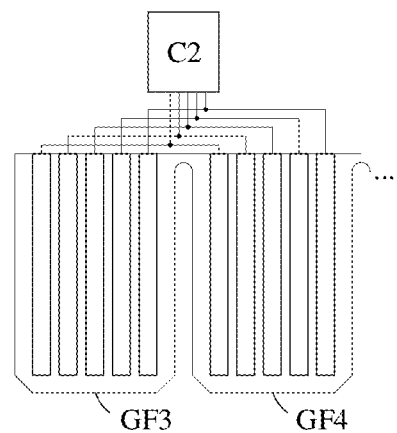
FIG. 3A is a schematic diagram 1 of an area A in FIG. 2 according to an embodiment.

FIG. 3A is a schematic diagram 1 of an area A in FIG. 2 according to the embodiments.

Each edge connector includes a plurality of pins (Pin), and the plurality of pins on each edge connector have different functions.

Quantities of pins included on edge connectors are equal. The quantity of pins included on each edge connector is not limited in this embodiment. For example, five pins are included on each edge connector shown in FIG. 3A.

The plurality of pins included on each connection terminal are respectively configured to transmit different types of signals. Different types of signals include a control signal and further include different types of status signals.

The status signal represents a current operating state of a circuit breaker, and a type of the status signal includes, but is not limited to, a circuit breaker in-position signal, a voltage sampling signal, a current sampling signal, a temperature sampling signal, and an indicator status signal of the circuit breaker.

The circuit breaker in-position signal represents whether the circuit breaker is in position. In some embodiments, the in-position signal is a level signal, and when the circuit breaker is in position, the in-position signal is at a high level; or when the circuit breaker is not in position, the in-position signal is at a low level.

The voltage sampling signal of the circuit breaker represents a voltage of a circuit connected to the circuit breaker in a current state, and can be obtained by a voltage sensor inside the circuit breaker. The current sampling signal of the circuit breaker represents a current flowing through the circuit breaker currently, and can be obtained by a current sensor inside the circuit breaker. The temperature sampling signal of the circuit breaker represents a current temperature of a circuit inside the circuit breaker, and can be obtained by a temperature sensor inside the circuit breaker.

The indicator status signal of the circuit breaker represents connection and disconnection of a circuit on which an indicator of the circuit breaker is located. An indicator of the circuit breaker is used to indicate whether the current circuit breaker is in a connected state or a disconnected state. The indicator of the circuit breaker is generally a light-emitting diode (LED). When the LED is off, it indicates that a circuit on which the LED is located is disconnected. A detection circuit may be disposed in the circuit breaker to detect a voltage at two ends of the LED. When the LED is off, a detection result of the detection circuit abnormally rises. In some embodiments, the in-position signal is a level signal. When the indicator is normal, the in-position signal is at a low level; or when the indicator is faulty, the in-position signal is at a high level.

The controller sends the control signal to the circuit breaker to control the circuit breaker to be disconnected or connected. In some embodiments, the control signal is a level signal. For example, a high level is used to control a circuit breaker to be closed, and a low level is used to control a circuit breaker to be disconnected.

The plurality of pins having different functions are arranged on the edge connector in a specific sequence, and arrangement sequences of pins used to transmit a same type of signals on each edge connector are the same. FIG. 3A is used as an example, and types of signals transmitted by five pins on the edge connector GF3 from left to right are sequentially: a transmitted in-position signal of a circuit breaker, a transmitted current sampling signal, a transmitted temperature sampling signal, a transmitted indicator status signal of the circuit breaker, and a transmitted control signal. In this way, types of signals transmitted by the five pins on each of the edge connectors from left to right are correspondingly the same as the five pins on the GF3.

When second ends of two edge connectors are connected, pins used to transmit a same type of signals are connected. Connecting pins used to transmit the same type of signals means connecting pins used to transmit a control signal, or connecting pins used to transmit a same type of status signal, for example, connecting pins used to transmit an in-position signal of a circuit breaker.

When the GF3 is connected to the GF4 in the figure, a first pin on the GF3 is correspondingly connected to a first pin on the GF4, a second pin on the GF3 is correspondingly connected to a second pin on the GF4, and by analogy.

In some other embodiments, to protect the controller, a resistor may further be disposed to limit a current, and to divide a voltage of the pin. Details are described below.

In a possible implementation, a second end of each connection terminal is connected to the controller by using at least one first resistor.

Figure 3B:
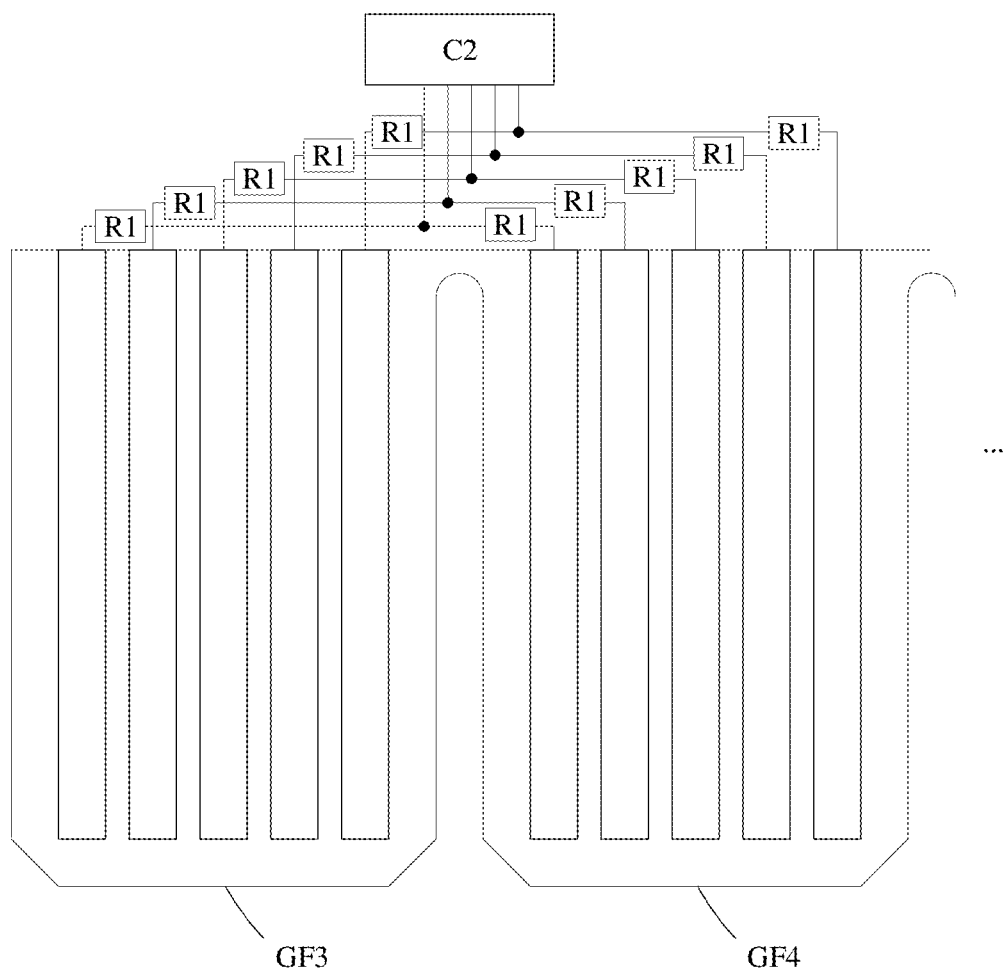
FIG. 3B is a schematic diagram 2 of an area A in FIG. 2 according to an embodiment.

FIG. 3B is a schematic diagram 2 of an area A in FIG. 2 according to an embodiment.

In this case, the collection board 100 further includes a plurality of first resistors R1. In this embodiment, an example in which the second end of each edge connector is connected to the controller by using one first resistor R1 is used. In this case, when the GF3 is connected to the GF4, pins having a same function include, on a connection line, two first resistors R1 connected in series.

When the implementation of this embodiment is used, regardless of whether the GF3 or the GF4 is inserted into the jack of the circuit breaker, a first resistor R1 is included on a connection line between any pin for signal transmission and the controller, thereby limiting a current flowing to the controller and a voltage shared by the controller, and implementing protection on the controller.

In another possible implementation, after second ends of at least every two connection terminals are connected, the second ends are connected to one controller by using at least one second resistor. Details are described below.

Figure 3C:
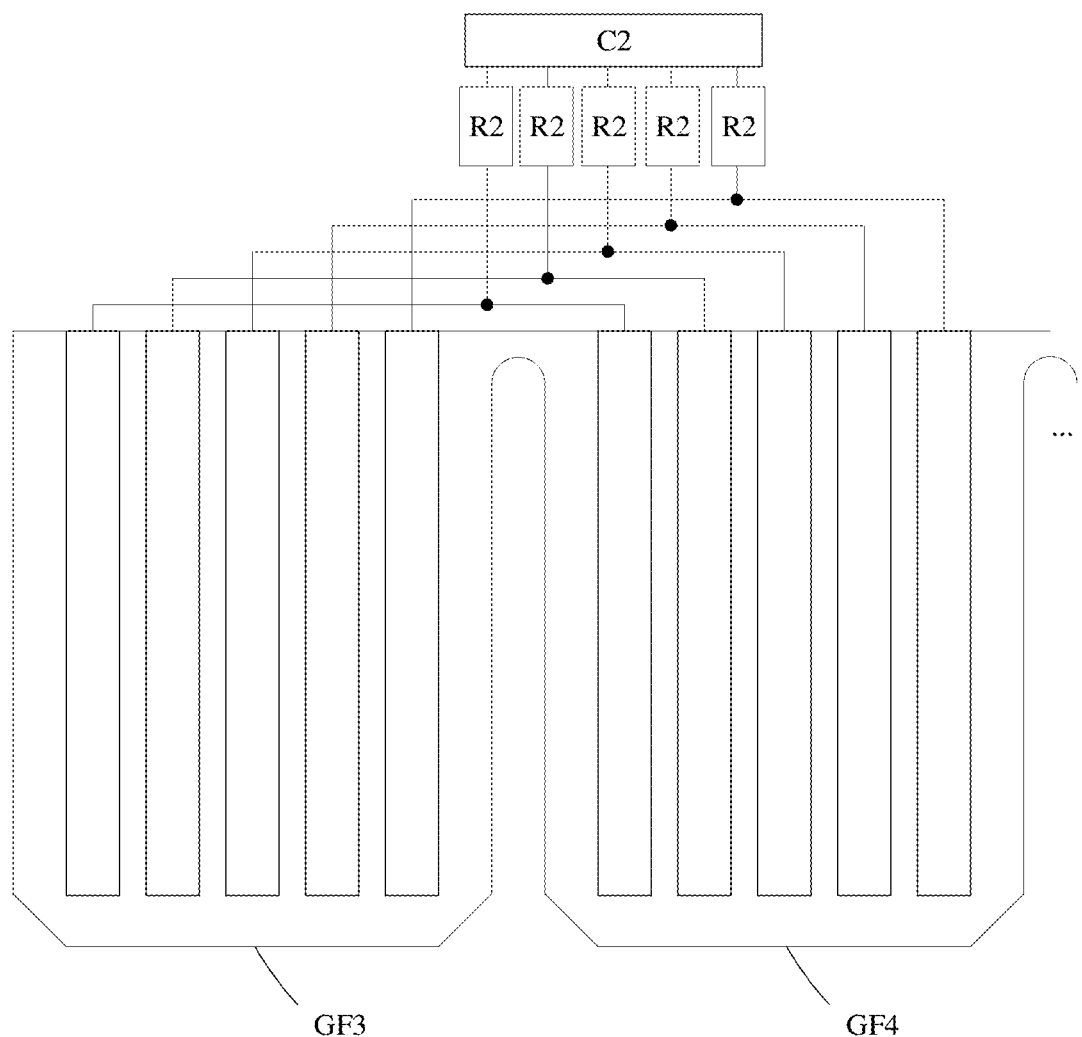
FIG. 3C is a schematic diagram 3 of an area A in FIG. 2 according to an embodiment.

FIG. 3C is a schematic diagram 3 of an area A in FIG. 2 according to an embodiment.

In this case, the collection board 100 further includes a plurality of second resistors R2. An example in which the second ends of every two edge connectors are connected to the controller by using one second resistor R2 is used in this embodiment, that is, when the GF3 and the GF4 are connected, after pins having a same function are connected, the pins are connected to the controller by using one second resistor R2.

When the implementation of this embodiment is used, regardless of whether the GF3 or the GF4 is inserted into the jack of the circuit breaker, at least one second resistor R2 is included on a connection line between any pin for signal transmission and the controller, thereby limiting a current flowing to the controller and a voltage shared by the controller, and implementing protection on the controller. In addition, compared with the implementation in FIG. 3B, a quantity of disposed resistors is further reduced in this implementation, thereby simplifying a circuit.

In still another possible implementation, both the foregoing first resistor and the foregoing second resistor may be disposed on the collection board. Details are described below.

Figure 3D:
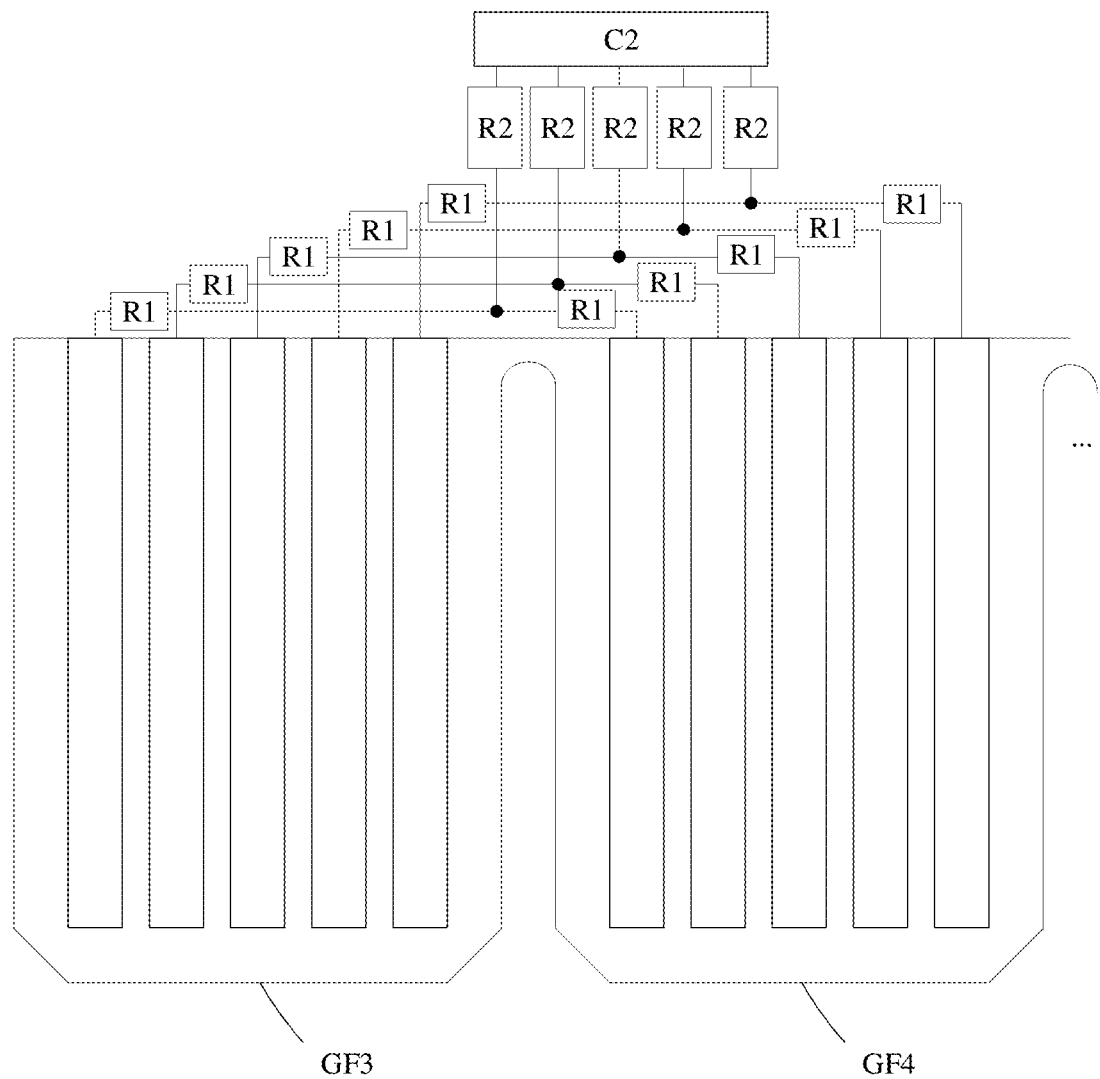
FIG. 3D is a schematic diagram 4 of an area A in FIG. 2 according to an embodiment.

FIG. 3D is a schematic diagram 4 of an area A in FIG. 2 according to an embodiment.

In this case, the collection board 100 includes both a first resistor R1 and a second resistor R2. After the second ends of every two edge connectors are connected by using two first resistors R1 connected in series, the second ends are connected to a controller by using one second resistor R2. A first end of the second resistor R2 is connected between two first resistors R1, and a second end of the second resistor R2 is connected to the controller.

When the implementation of this embodiment is used, regardless of whether the GF3 or the GF4 is inserted into the jack of the circuit breaker, the first resistors R1 connected in series and the second resistor R2 are all included on a connection line between any pin for signal transmission and the controller, thereby limiting a current flowing to the controller and a voltage shared by the controller, and implementing protection on the controller.

A plurality of connection terminals included in a power distribution subrack include a plurality of groups of connection terminals, each of the plurality of groups of connection terminals includes at least two connection terminals, and second ends of the at least two connection terminals included in each of the plurality of groups of connection terminals are connected to a same controller.

The following is an implementation in which second ends of two connection terminals included in each of the plurality of groups of connection terminals are connected to a same controller. Continue using an example in which the connection terminal is an edge connector for description below.

Continue refer to the power distribution subrack shown in FIG. 2. An even number of edge connectors are disposed on the collection board 100, and second ends of every two edge connectors are connected.

In the figure, an example in which 18 edge connectors are disposed on the collection board is used. In some other embodiments, a principle used when another quantity of edge connectors are disposed on the collection board 100 is similar. Details are no longer described herein in this embodiment.

In this case, nine controllers are correspondingly disposed on the collection board 100, and the collection board 100 can detect and control operating states of a maximum of nine circuit breakers.

Figure 4:
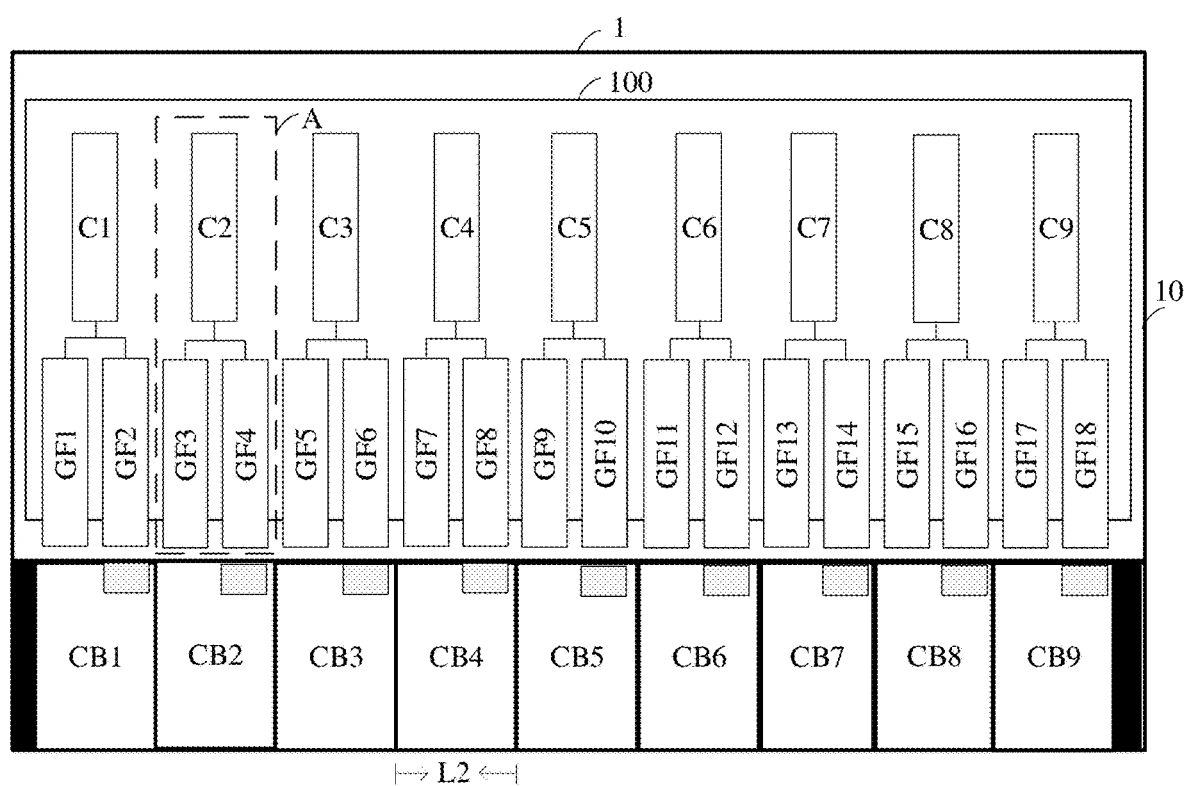
FIG. 4 is a schematic diagram 1 of an application scenario of a power distribution subrack according to an embodiment.

FIG. 4 is a schematic diagram 1 of an application scenario of a power distribution subrack according to an embodiment.

In a typical application scenario of the power distribution subrack provided in this embodiment, the power distribution subrack is used to distribute power to a device of a base station. In this case, a plurality of circuit breakers are generally plug-connected on the power distribution subrack, and each circuit breaker is connected to one power supply or load device. The load device may be a temperature control device, such as an air conditioner or a fan. Alternatively, the load device may be a remote radio unit (RRU) or a baseband processing unit (BBU).

An operating current that may be borne by a circuit breaker with a width of 20 mm is less than an operating current that may be borne by a circuit breaker with a width of 30 mm When an operating current of the power supply or load device connected to the circuit breaker is large, the circuit breaker with the width of 30 mm is plug-connected on the power distribution subrack. When an operating current of the power supply or load device connected to the circuit breaker is small, the circuit breaker with the width of 20 mm is plug-connected on the power distribution subrack.

For the power distribution subrack shown in FIG. 4, in this case, the power distribution subrack is used to distribute power to a load device with a relatively small operating current, only the circuit breaker with the width of 20 mm may be plug-connected on the power distribution subrack, so that starting all the controllers is ensured. In addition, compared with the solution in FIG. 1, a quantity of controllers is reduced by half, material costs of a collection board are reduced, and practicability of the power distribution subrack is improved.

The collection board 100 further supports a mixed plug-connection of the circuit breaker (in other words, L1 in the figure) with the width of 30 mm and the circuit breaker (in other words, L2 in the figure) with the width of 20 mm. Details are described below.

The collection board 100 shown in FIG. 2 is mixedly plug-connected to four circuit breakers with a width of 30 mm and three circuit breakers with a width of 20 mm.

Figure 5:
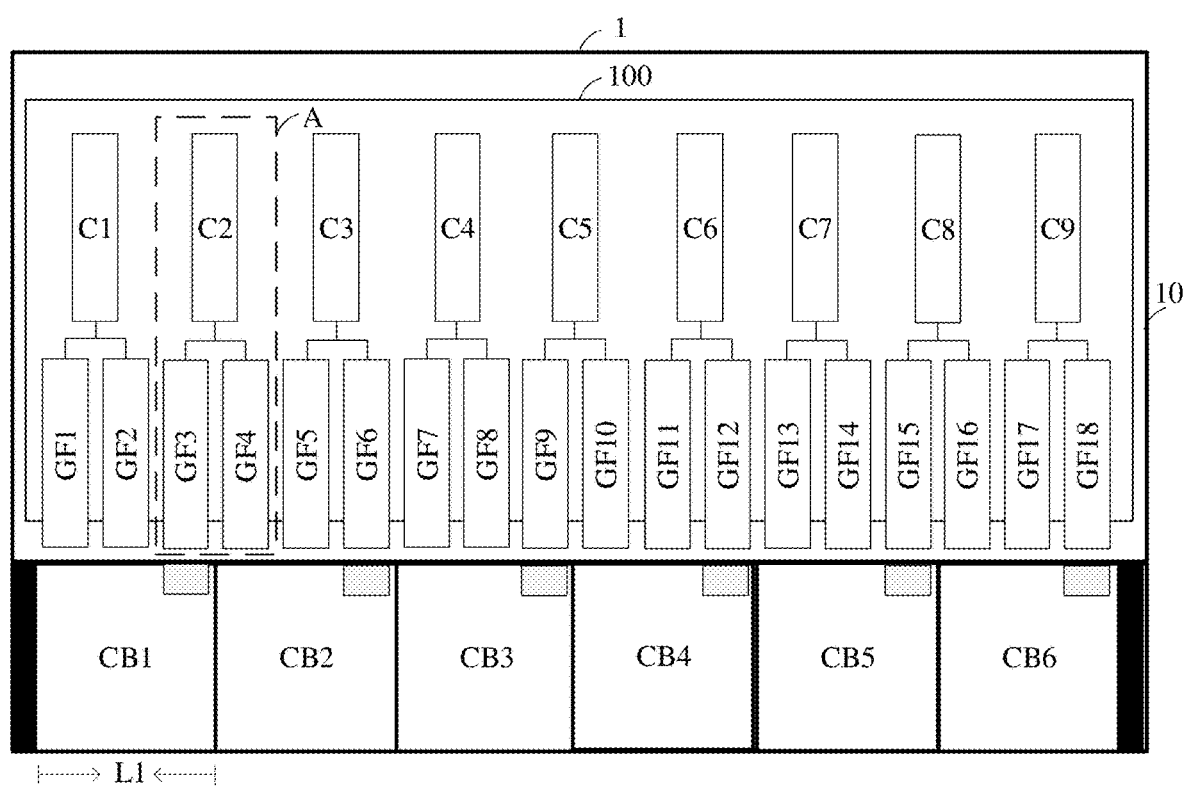
FIG. 5 is a schematic diagram 2 of an application scenario of a power distribution subrack according to an embodiment.
Figure 6:
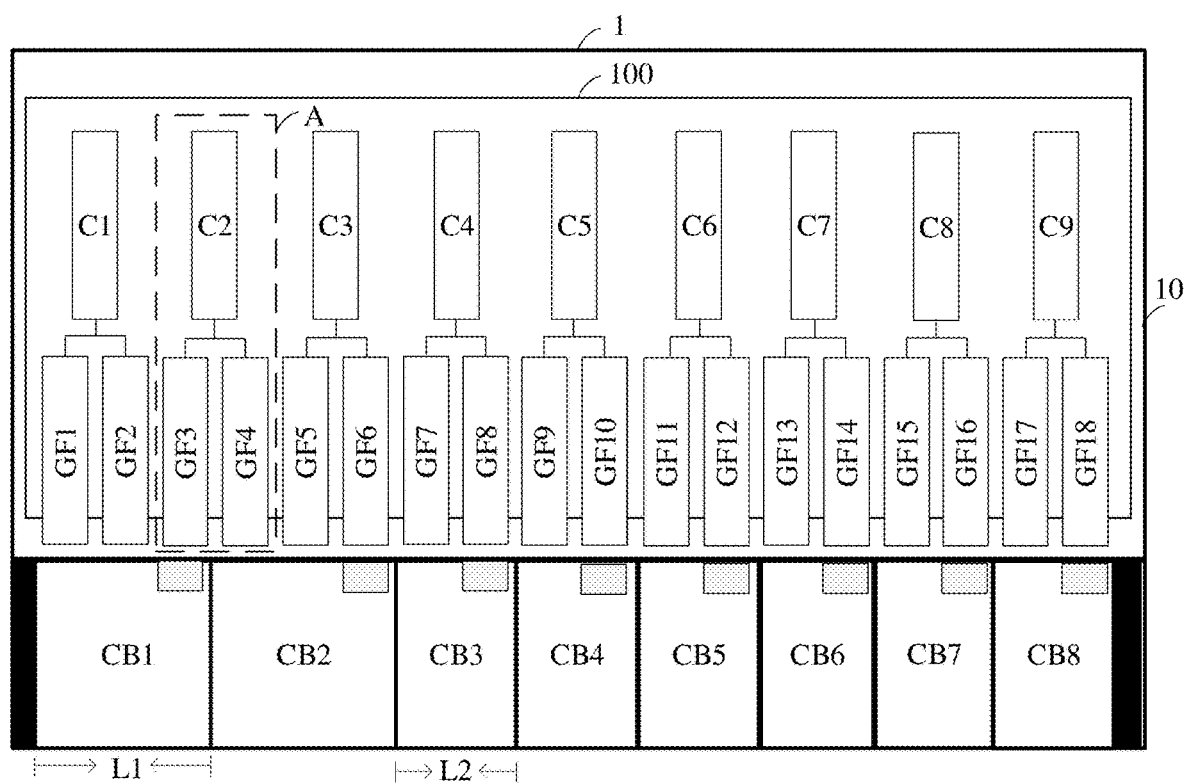
FIG. 6 is a schematic diagram 3 of an application scenario of a power distribution subrack according to an embodiment.

Refer to both FIG. 5 and FIG. 6. A collection board 100 shown in FIG. 5 is plug-connected to six circuit breakers with a width of 30 mm. A collection board 100 shown in FIG. 6 is mixedly plug-connected to two circuit breakers with a width of 30 mm and six circuit breakers with a width of 20 mm.

Figure 7:
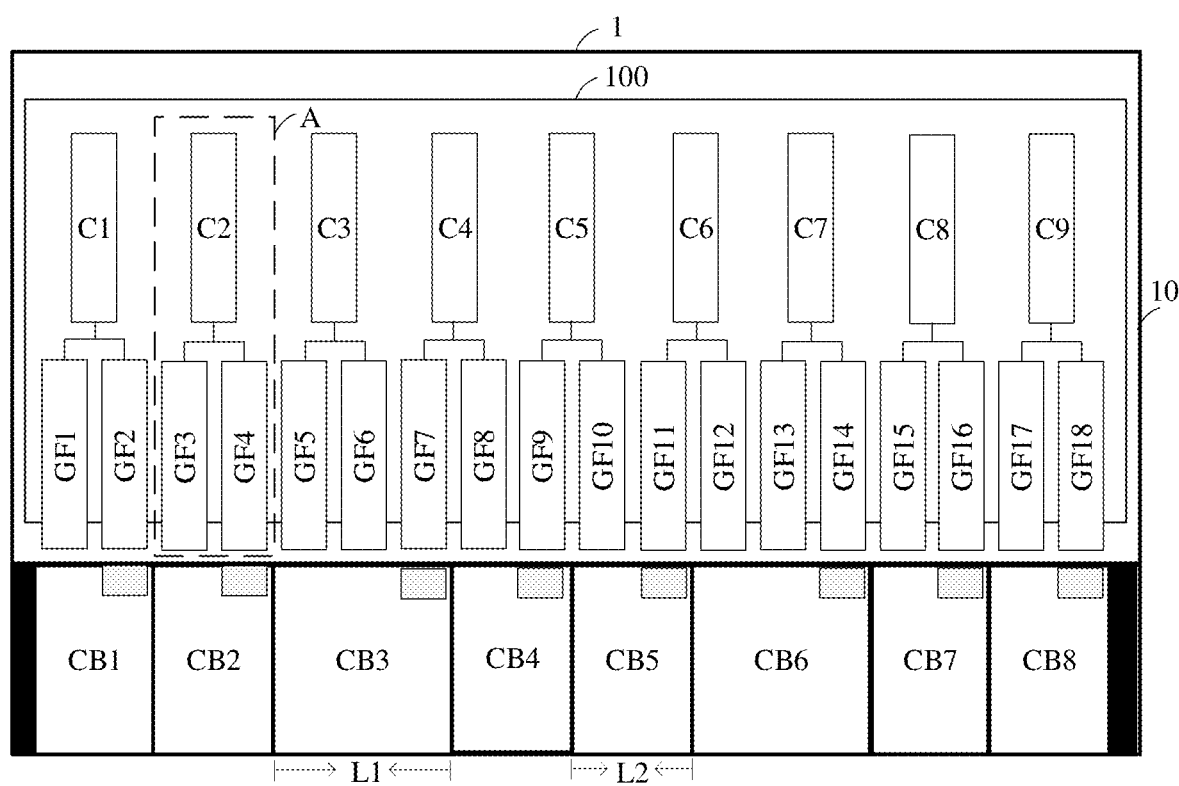
FIG. 7 is a schematic diagram 4 of an application scenario of a power distribution subrack according to an embodiment.

Further, refer to a schematic diagram of an application scenario of a power distribution subrack shown in FIG. 7. In this case, compared with FIG. 6, in FIG. 7, the collection board is also plug-connected to two circuit breakers with a width of 30 mm and six circuit breakers with a width of 20 mm. However, arrangement manners of the circuit breakers are different. Correspondingly, controllers started in this case are also different. Controllers started in FIG. 6 are C2 to C9, and controllers started in FIG. 7 are C1, C2, and C4 to C9. That is, when every two connection terminals are connected to one controller, the power distribution subrack supports a mixed plug-connection of the circuit breaker with the width of 30 mm and the circuit breaker with the width of 20 mm in any arrangement sequence, thereby improving practicability and convenience of the power distribution subrack.

The collection board in this embodiment may implement a mixed plug-connection of the circuit breaker with the width of 30 mm and the circuit breaker with the width of 20 mm in any arrangement sequence. This is because when an edge connector is disposed in a basic unit of 10 mm, two edge connectors are connected to one controller, in this case, the controller may be considered as being disposed in a basic unit of 20 mm. Continue refer to FIG. 2. However, when two circuit breakers with a width of 30 mm are adjacent, the CB1 and the CB2 in the figure are used as an example, a distance between jacks of the CB1 and the CB2 is 30 mm, and is greater than the basic unit specified for the controller. When the circuit breaker with the width of 20 mm and the circuit breaker with the width of 30 mm appear in sequence, the CB4 and the CB5 in the figure are used as an example, and a distance between jacks of the CB4 and the CB5 is 30 mm, and is greater than the basic unit specified for the controller. When the circuit breaker with the width of 30 mm and the circuit breaker with the width of 20 mm appear in sequence, the CB5 and the CB6 in the figure are used as an example, and a distance between jacks of the CB5 and the CB6 is 20 mm, and is equal to the basic unit specified for the controller. When two circuit breakers with a width of 20 mm appear to be adjacent, the CB3 and the CB4 in the figure are used as an example, and a distance between jacks of the CB3 and the CB4 is 20 mm, and is equal to a basic unit specified for the controller, that is, when circuit breakers with different widths are arranged in any sequence, a case in which two edge connectors correspondingly connected to one controller can be simultaneously inserted into jacks of two circuit breakers does not occur. Therefore, the power distribution subrack provided in this embodiment imposes no limitation on a sequence in which the circuit breakers with the different widths are plug-connected. In addition, circuit breakers may be tightly plug-connected on the power distribution subrack, thereby fully utilizing a width of the collection board is fully utilized, and improving practicability of the power distribution subrack.

To sum up, based on the power distribution subrack provided in this embodiment, second ends of every two connection terminals are connected to one controller. Controllers in an idle state are reduced, and utilization of the controllers is increased. In addition, a quantity of controllers disposed on the collection board is reduced by half, thereby further reducing space that is on the collection board and that is occupied by the controller and reducing material costs of the collection board. In addition, the collection board of the power distribution subrack further supports a mixed plug-connection of circuit breakers with different widths in any sequence, and each circuit breaker may be tightly plug-connected on the power distribution subrack, thereby improving practicability and convenience.

The following is an implementation in which second ends of three connection terminals included in each of the plurality of groups of connection terminals are connected to a same controller.

Figure 8:
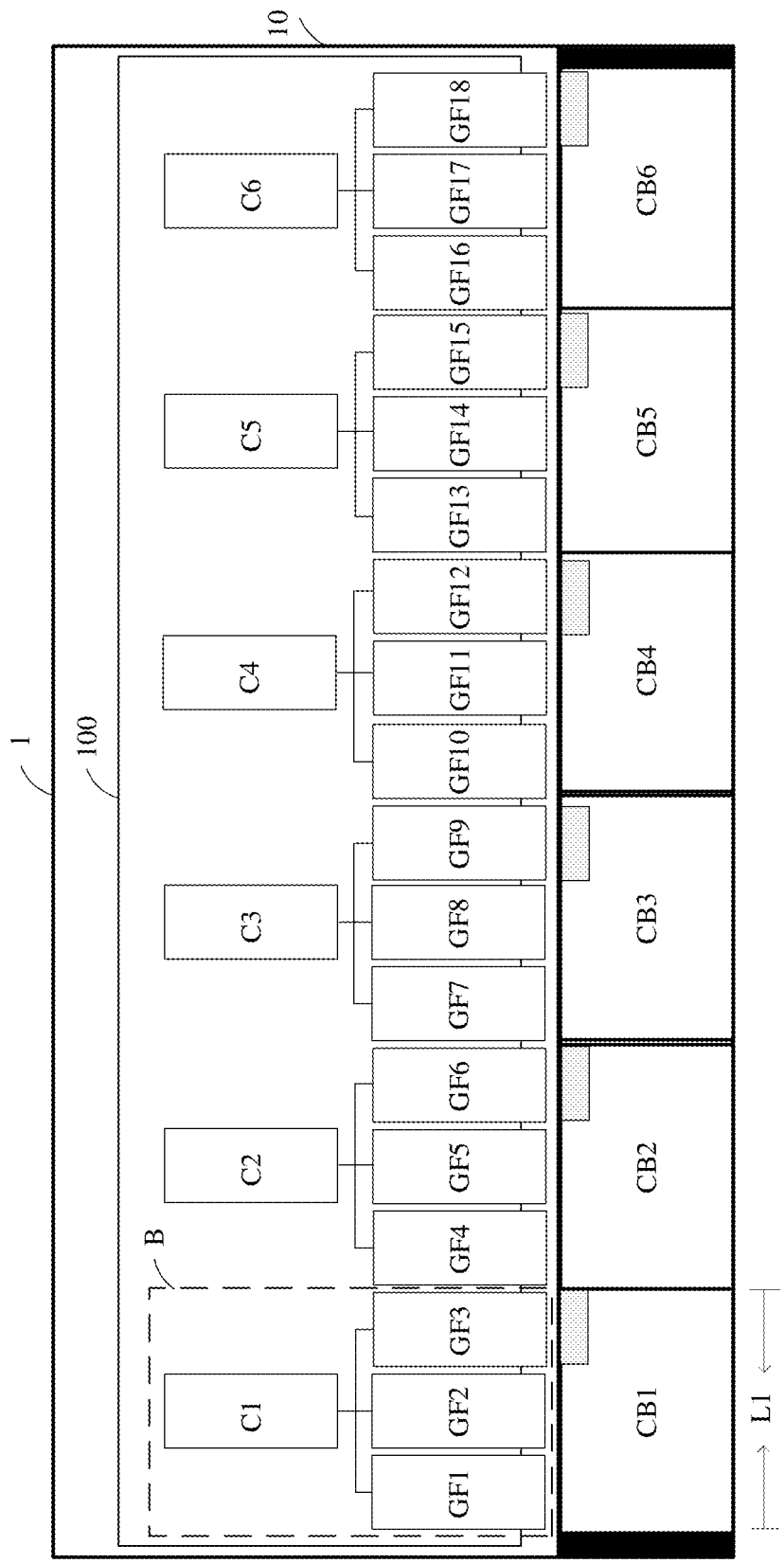
FIG. 8 is a top view of another power distribution subrack according to an embodiment.

FIG. 8 is a top view of another power distribution subrack according to an embodiment.

A collection board of the power distribution subrack shown in the figure includes edge connectors GF1 to GF18 and controllers C1 to C6.

Figure 9A:
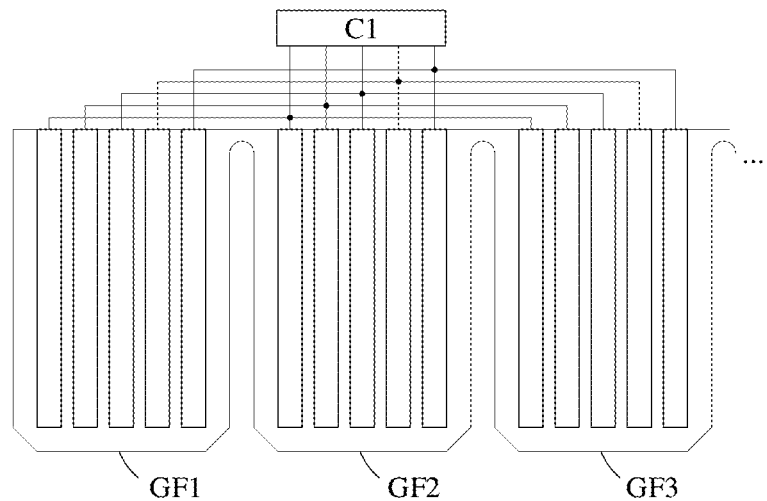
FIG. 9A is a schematic diagram 1 of an area B in FIG. 8 according to an embodiment.

Second ends of every three edge connectors are correspondingly connected to one controller. For a specific connection manner of the edge connector, refer to FIG. 9A. FIG. 9A corresponds to an area B in FIG. 8.

In the figure, an example in which the collection board 100 includes 18 edge connectors is used. In some other embodiments, a principle used when another quantity of edge connectors are disposed on the collection board 100 is similar. Details are no longer described herein in this embodiment.

To protect the controller, a resistor may further be disposed to limit a current, and to divide a voltage of a pin. Details are described below.

In a possible implementation, a second end of each connection terminal is connected to the controller by using at least one first resistor R1.

Figure 9B:
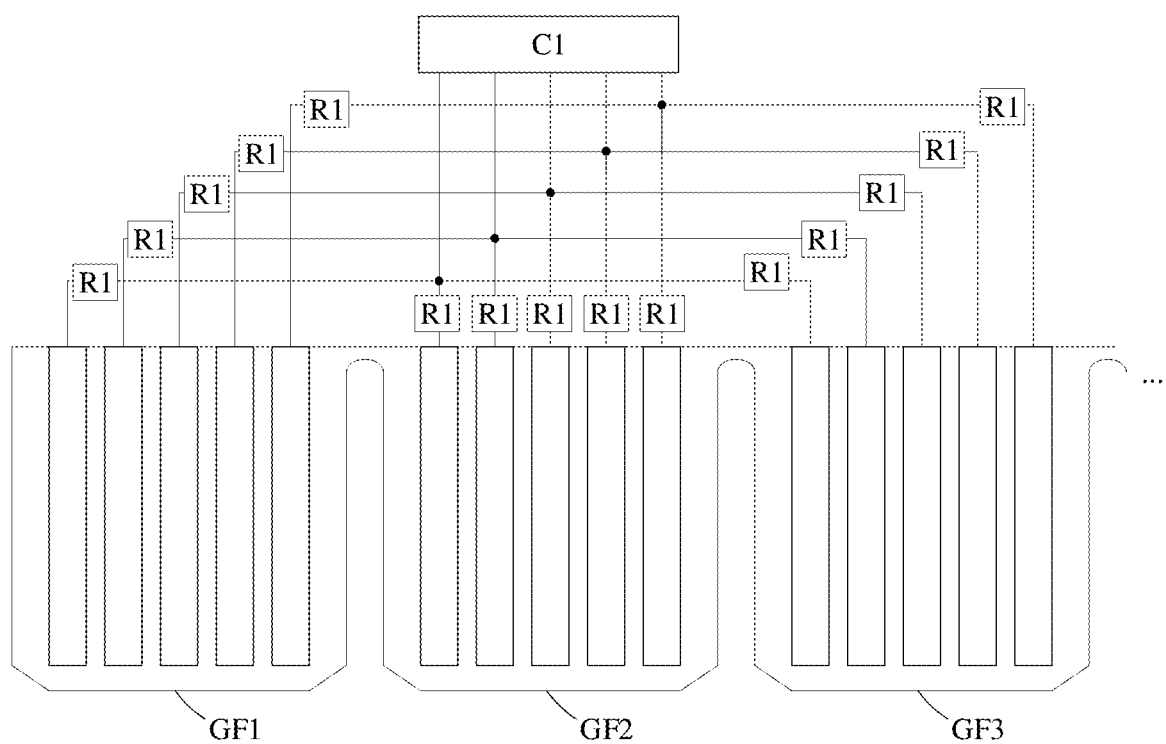
FIG. 9B is a schematic diagram 2 of an area B in FIG. 8 according to an embodiment.

FIG. 9B is a schematic diagram 2 of an area B in FIG. 8 according to an embodiment.

In this case, a collection board 100 includes a plurality of first resistors R1. In this embodiment, an example in which a second end of each edge connector is connected to a controller by using one first resistor R1 is used for description. In this case, one first resistor R1 is included on a connection line between any pin for signal transmission and the controller, thereby limiting a current flowing to the controller and a voltage shared by the controller, and implementing protection on the controller.

In another possible implementation, after second ends of every three edge connectors are connected, the second ends are connected to one controller by using at least one second resistor R2. Details are described below.

Figure 9C:
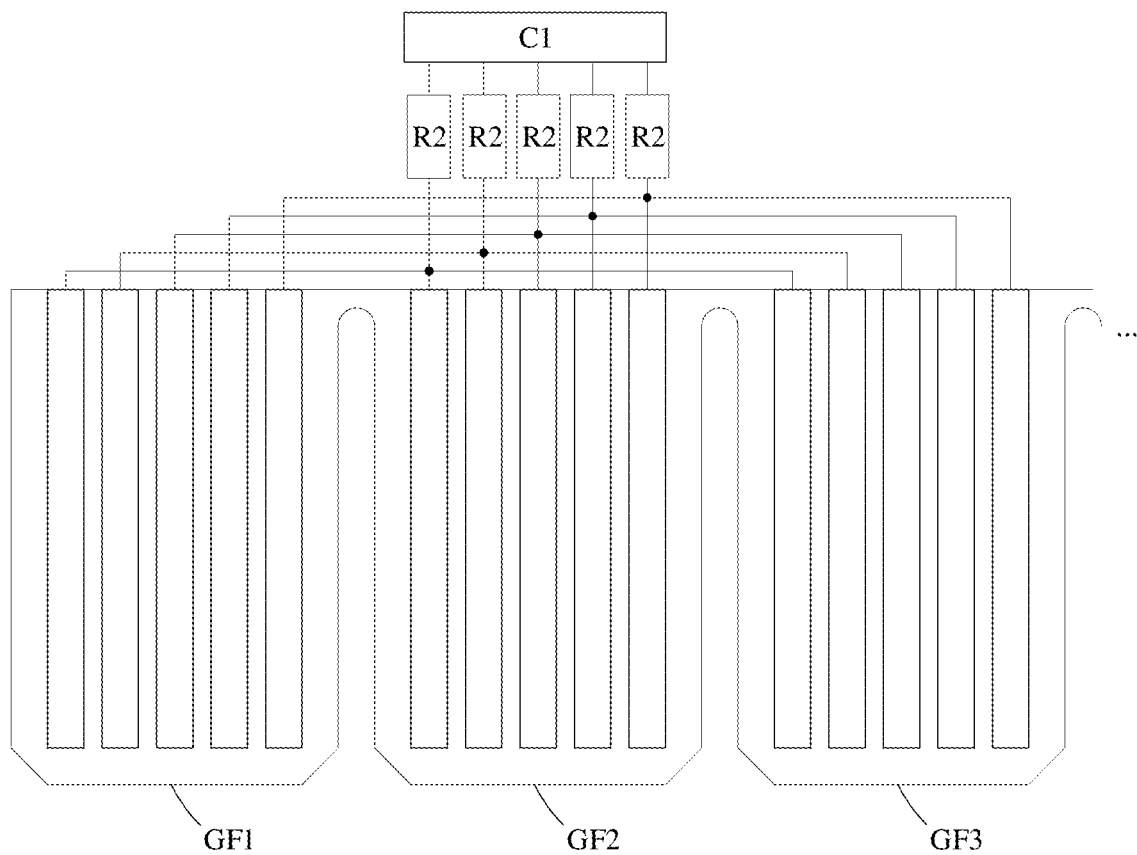
FIG. 9C is a schematic diagram 3 of an area B in FIG. 8 according to an embodiment.

FIG. 9C is a schematic diagram 3 of an area B in FIG. 8 according to an embodiment.

In this case, a collection board 100 includes a plurality of second resistors R2. In this embodiment, an example in which after second ends of every three edge connectors are connected, the second ends are connected to a controller by using one second resistor R2 is used. In this case, one second resistor R2 is included on a connection line between any pin for signal transmission and the controller, thereby limiting a current flowing to the controller and a voltage shared by the controller, and implementing protection on the controller. In addition, compared with the implementation in FIG. 9B, a quantity of disposed resistors is further reduced in this implementation, thereby simplifying a circuit.

In still another possible implementation, both the foregoing first resistor and the foregoing second resistor may be disposed on the collection board. Details are described below.

Figure 9D:
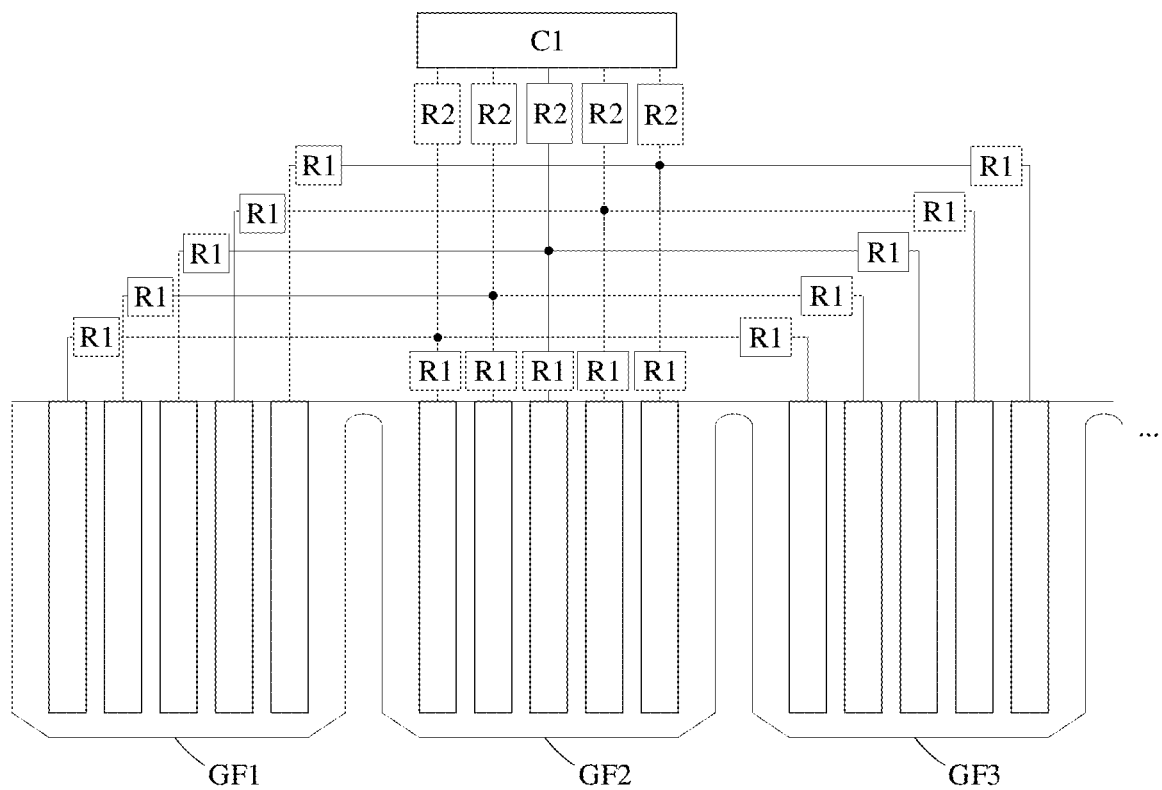
FIG. 9D is a schematic diagram 4 of an area B in FIG. 8 according to an embodiment.

FIG. 9D is a schematic diagram 4 of an area B in FIG. 8 according to an embodiment.

In this case, a collection board 100 includes both a first resistor R1 and a second resistor R2. In this case, after a second end of each edge connector is connected by using one first resistor R1 and one second resistor R2, the second end is connected to a controller, thereby implementing protection on the controller.

Six controllers are correspondingly disposed on the collection board 100 shown in FIG. 8. Therefore, the collection board 100 can detect and control operating states of a maximum of six circuit breakers.

An operating current of a circuit breaker with a width of 30 mm is greater than an operating current of a circuit breaker with a width of 20 mm. Therefore, when a power distribution subrack is used to distribute power to a load device or a power supply with a relatively large operating current, only the circuit breaker with the width of 30 mm is plug-connected on the power distribution subrack, so that starting all the controllers is ensured. In addition, a quantity of disposed controllers is only one-third of that in the solution in FIG. 1, thereby reducing material costs of the collection board, and improving practicability of the power distribution subrack.

In addition, the collection board 100 further supports a mixed plug-connection of the circuit breaker with the width of 30 mm (that is, L1 in the figure) and the circuit breaker with the width of 20 mm, that is, supports power distribution to both a load device or a power supply with a relatively large operating current and a load device or a power supply with a relatively small operating current. Details are described below.

Figure 10:
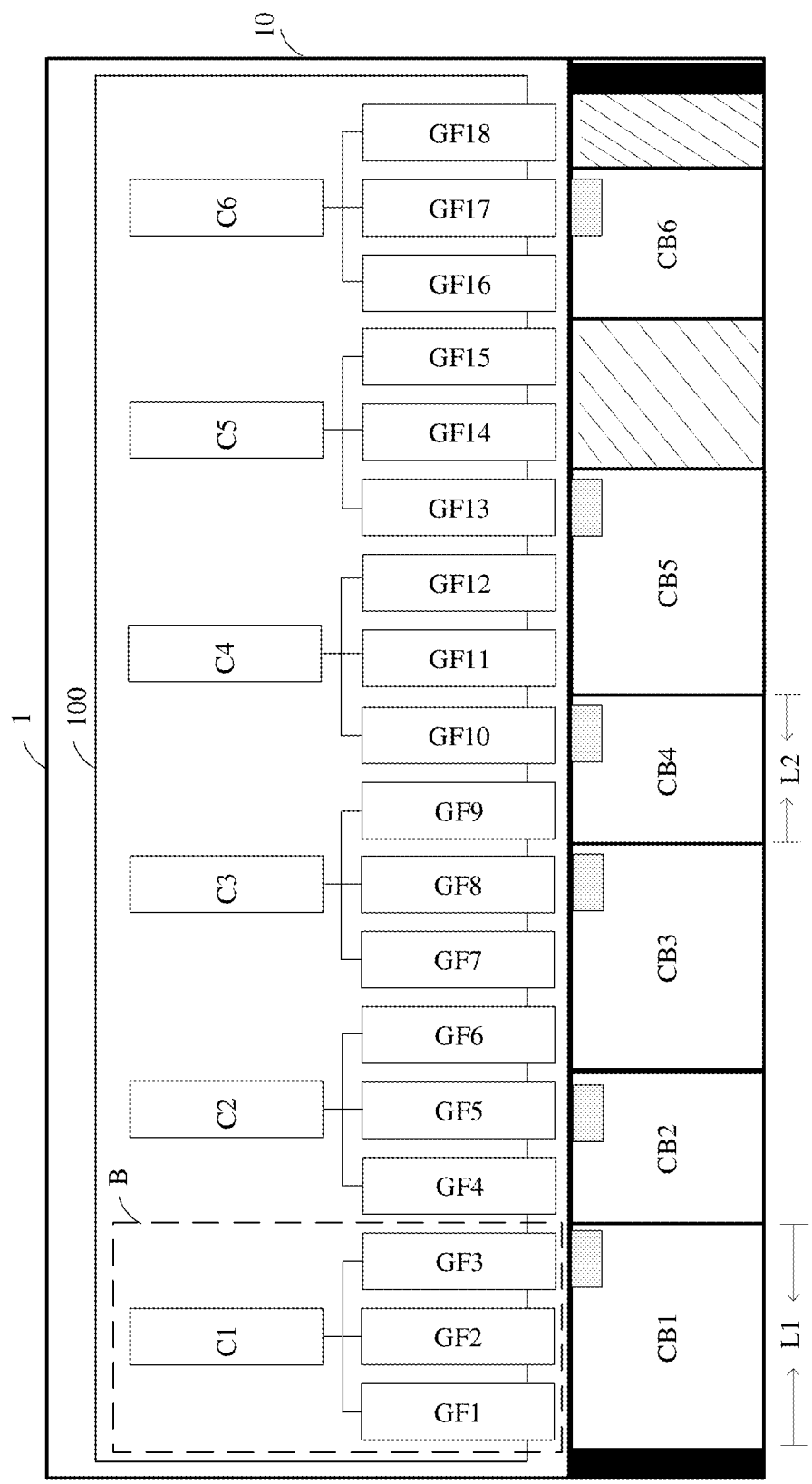
FIG. 10 is a schematic diagram 5 of an application scenario of a power distribution subrack according to an embodiment.

FIG. 10 is a schematic diagram 5 of an application scenario of a power distribution subrack according to an embodiment.

A collection board 100 is mixedly plug-connected to three circuit breakers with a width of 30 mm and three circuit breakers with a width of 20 mm.

One edge connector is disposed within a width of every 10 mm, and second ends of three edge connectors are correspondingly connected to one controller. In this case, the controller may be considered to be disposed in a basic unit of 30 mm. A controller connected to a circuit breaker CB5 shown in the figure is a C5. If a circuit breaker CB6 is disposed close to a circuit breaker CB5, a jack of the circuit breaker CB6 corresponds to a GF15. However, the controller C5 connected to the GF15 is configured to control the circuit breaker CB5. Therefore, the circuit breaker CB6 and the circuit breaker CB5 may be separated by 20 mm (that is, an area covered by shadow lines in the figure) in a manner shown in the figure, so that the jack of the circuit breaker CB6 corresponds to a GF17, and the circuit breaker CB6 is connected to a controller C6.

In addition, alternatively, the circuit breaker CB6 and the circuit breaker CB5 may be separated by 10 mm, so that the jack of the circuit breaker CB6 corresponds to the GF16. Alternatively, the circuit breaker CB6 and the circuit breaker CB5 are separated by 30 mm, so that the jack of the circuit breaker CB6 corresponds to a GF18. The circuit breaker CB6 and the controller C6 can be connected in the two cases.

To sum up, based on the power distribution subrack provided in this embodiment, the second ends of the three connection terminals are connected to one controller. Controllers in an idle state are reduced, and utilization of the controllers is increased. In addition, a quantity of controllers disposed on the collection board is reduced, thereby reducing space that is on the collection board and that is occupied by the controller and reducing material costs of the collection board. In addition, the collection board of the power distribution subrack further supports a mixed plug-connection between circuit breakers with different widths in any sequence, that is, the power distribution subrack may distribute power to both a device with a relatively large power and operating current and a device with a relatively small power and operating current, thereby improving convenience and availability.

The following is an implementation in which second ends of four connection terminals included in each of the plurality of groups of connection terminals are connected to a same controller.

Figure 11:
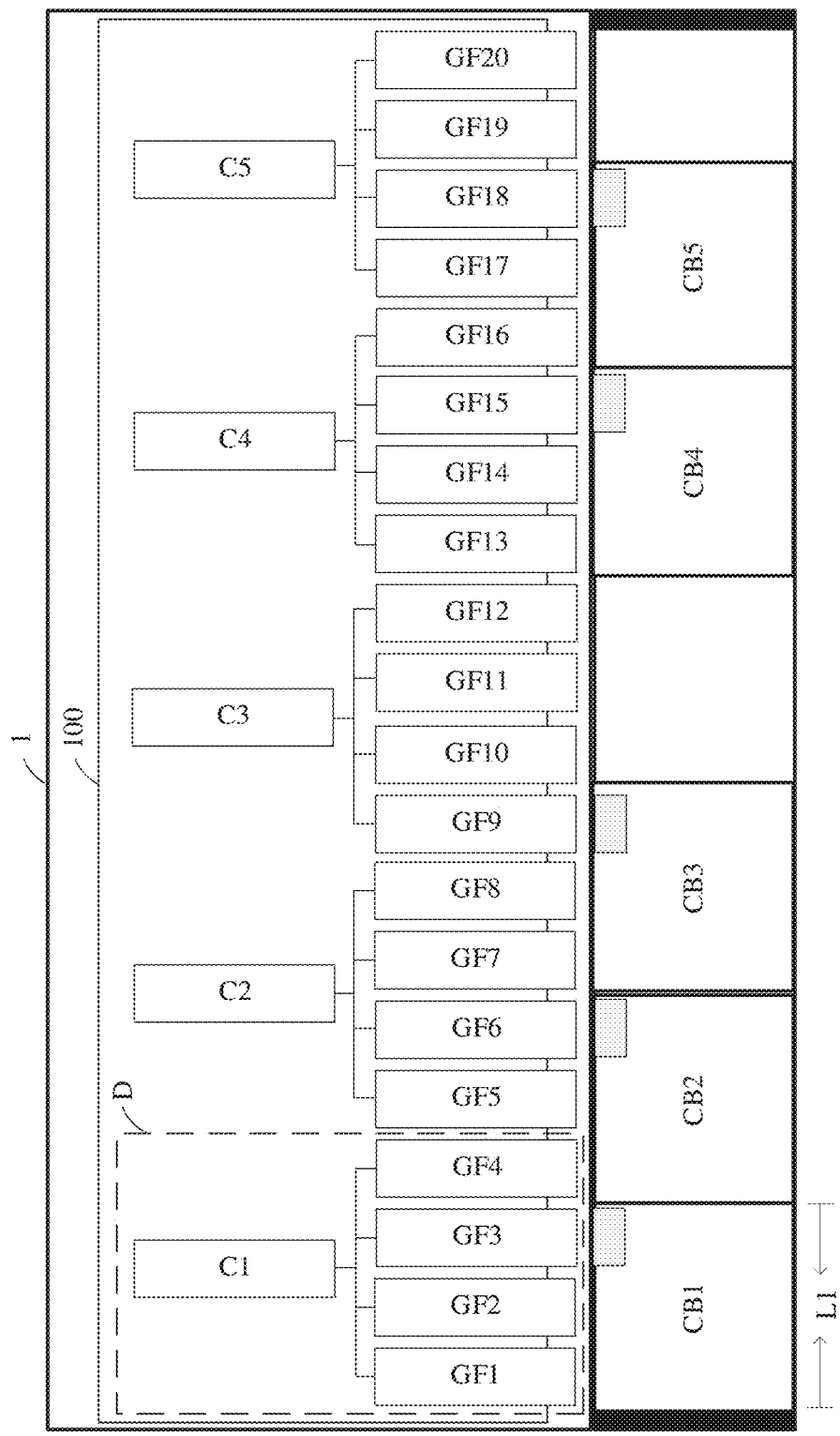
FIG. 11 is a top view of still another power distribution subrack according to an embodiment.

FIG. 11 is a top view of still another power distribution subrack according to an embodiment.

A collection board of the power distribution subrack shown in the figure includes edge connectors GF1 to GF20 and controllers C1 to C5.

Figure 12:
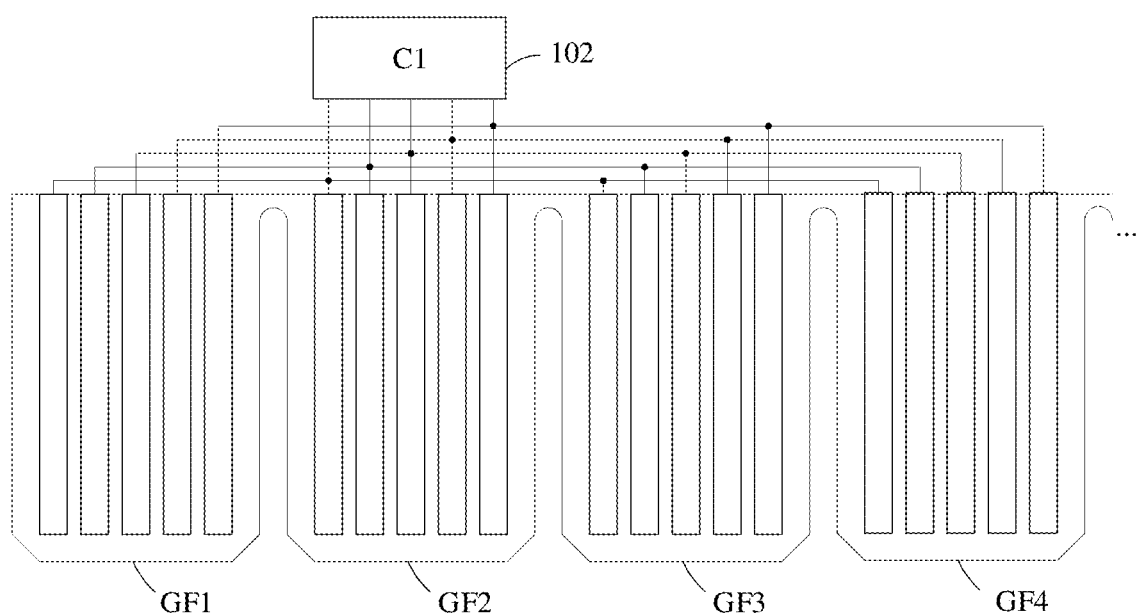
FIG. 12 is a schematic diagram of an area D in FIG. 11 according to an embodiment.

Second ends of every four edge connectors are correspondingly connected to one controller. For a specific connection manner of the edge connector, refer to FIG. 12. FIG. 12 corresponds to an area D in FIG. 11.

In the figure, an example in which the collection board 100 includes 20 edge connectors is used. In some other embodiments, a principle used when another quantity of edge connectors are disposed on the collection board 100 is similar. Details are no longer described herein in this embodiment.

To protect the controller, a resistor may further be disposed on the collection board to limit a current, and to divide a voltage of a pin, that is, the controller is protected by disposing a first resistor and/or a second resistor. A specific implementation of disposing the resistor is similar to the manners in FIG. 3B to FIG. 3D and FIG. 9B to FIG. 9D. Details are no longer described herein in this embodiment.

Five controllers are correspondingly disposed on the collection board 100 shown in FIG. 11. Therefore, the collection board 100 may detect and control operating states of a maximum of five circuit breakers. The collection board 100 supports a mixed plug-connection of a circuit breaker (that is, L1 in the figure) with a width of 30 mm and a circuit breaker with a width of 20 mm. FIG. 11 shows an application scenario in which only a circuit breaker with a width of 30 mm is plug-connected to the collection board 100.

Figure 13:
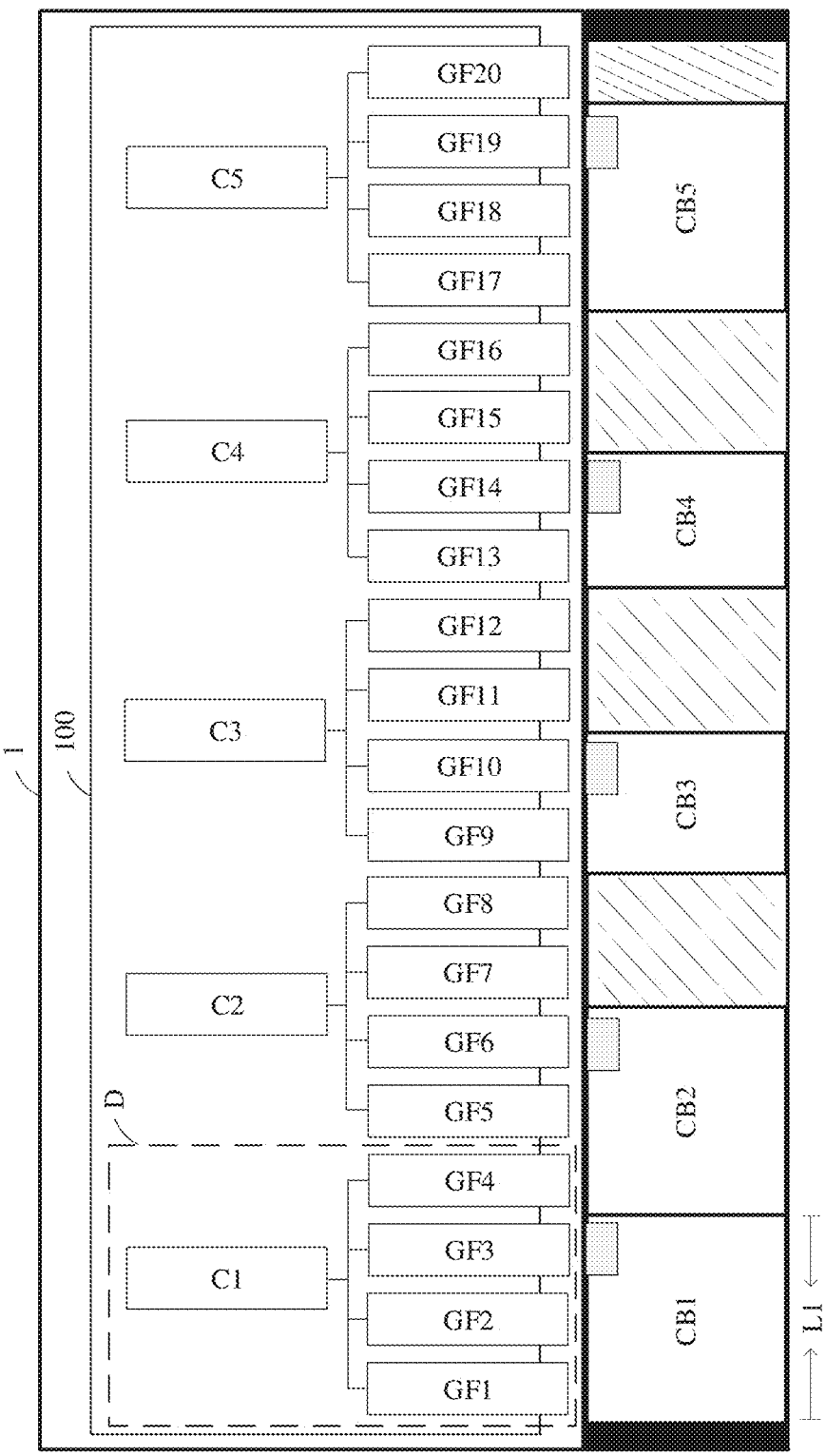
FIG. 13 is a schematic diagram 6 of an application scenario of a power distribution subrack according to an embodiment.

FIG. 13 is a schematic diagram 6 of an application scenario of a power distribution subrack according to an embodiment.

A collection board 100 is mixedly plug-connected to three circuit breakers with a width of 30 mm and two circuit breakers with a width of 20 mm.

When an edge connector is disposed in a basic unit of 10 mm, that is, one edge connector is disposed within a width of every 10 mm, second ends of four edge connectors are correspondingly connected to one controller. In this case, the controller may be considered to be disposed in a basic unit of 40 mm that is greater than the two widths of the foregoing circuit breakers. When the circuit breakers with two widths are tightly disposed, jacks of circuit breakers correspondingly exist at locations of two edge connectors among four edge connectors connected to a same controller. However, one controller is configured to control only one circuit breaker. Therefore, the manner shown in FIG. 13 may be used, so that only one of edge connectors corresponding to each controller is inserted into a jack of a circuit breaker by separating circuit breakers by a distance (that is, an area covered by shadow lines in the figure).

With reference to the accompanying drawing, a controller connected to a circuit breaker CB2 shown in the figure is a C2. If a circuit breaker CB3 is disposed close to a circuit breaker CB2, a jack of the circuit breaker CB3 corresponds to a GF8. However, the controller C2 connected to the GF8 is configured to control the circuit breaker CB2. Therefore, the circuit breaker CB3 and the circuit breaker CB2 are separated by 20 mm in a manner shown in the figure, so that the jack of the circuit breaker CB3 corresponds to a GF10, and the circuit breaker CB3 is connected to the controller C3.

In addition, alternatively, the circuit breaker CB3 and the circuit breaker CB2 may be separated by 30 mm, so that the jack of the circuit breaker CB3 corresponds to a GF11. Alternatively, the circuit breaker CB3 and the circuit breaker CB2 are separated by 40 mm, so that the jack of the circuit breaker CB3 corresponds to a GF12. The circuit breaker CB3 and the controller C3 may be connected in the two cases.

Therefore, based on the power distribution subrack provided in this embodiment, the four connection terminals share one controller. Controllers in an idle state are reduced, and utilization of the controllers is increased. In addition, a quantity of controllers disposed on the collection board is reduced, thereby further reducing space that is on the collection board and that is occupied by the controller and reducing material costs of the collection board. In addition, the collection board of the power distribution subrack further supports a mixed plug-connection between circuit breakers with different widths in any sequence, thereby improving convenience.

In some other implementations, to enable the power distribution subrack to distribute power to both a device with a relatively large power and operating current and a device with a relatively small power and operating current, to implement tight arrangement of circuit breakers when the circuit breakers are plugged-connected, and to fully utilize a width of the collection board, the collection board of the power distribution subrack may be divided into a plurality of areas, each area includes at least one controller and a plurality of edge connectors, and a quantity of connection terminals correspondingly connected to one controller in different areas is different. In this case, when the circuit breaker is plugged-connected, appearance of the separation areas (that is, the areas covered by the shadow lines in the figures) shown in FIG. 10 and FIG. 13 may be avoided, to improve practicability of the power distribution subrack. Details are described below.

The collection board includes at least one first area. Among a plurality of connection terminals distributed in the at least one first area, second ends of every M connection terminals are connected to a same controller. The at least one first area is configured to be plug-connected to a first circuit breaker. The collection board may further include at least one second area. Among a plurality of connection terminals distributed in the at least one second area, second ends of every N connection terminals are connected to a same controller. The at least one second area is configured to be plug-connected to a second circuit breaker. A width of the first circuit breaker is different from a width of the second circuit breaker, that is, specifications of the first circuit breaker are different from specifications of the second circuit breaker. N is an integer greater than or equal to 2, and M is unequal to N.

Figure 14:
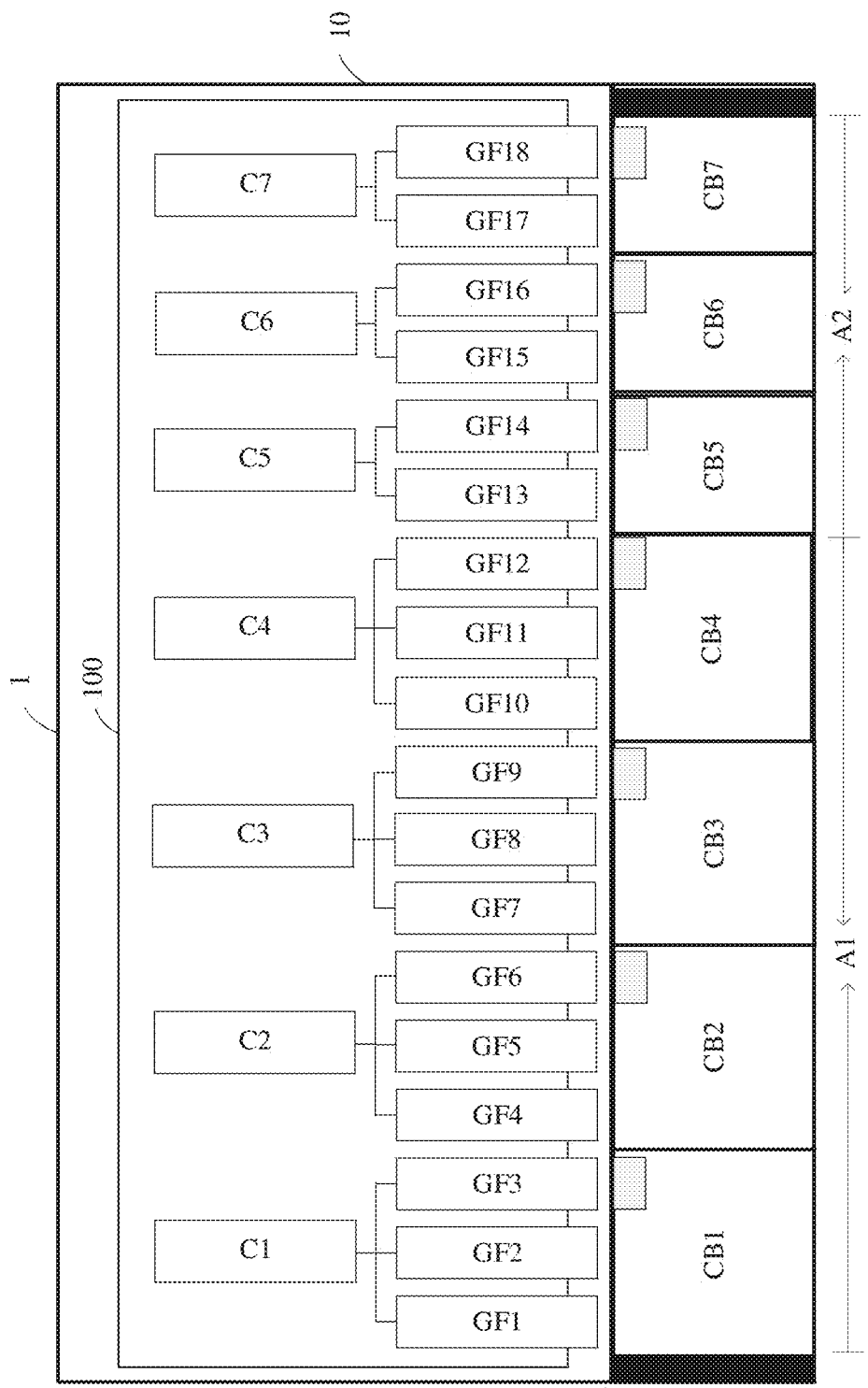
FIG. 14 is a schematic diagram of yet another power distribution subrack according to an embodiment.

FIG. 14 is a schematic diagram of yet another power distribution subrack according to an embodiment.

A collection board 100 includes at least one first area and at least one second area. In this embodiment, an example in which the collection board 100 includes one first area and one second area is used for description. An implementation in which the collection board 100 includes a plurality of first areas and a plurality of second areas is similar. Details are no longer described herein.

A width of the first area corresponds to A1 in the figure, and a width of the second area corresponds to A2 in the figure. A location corresponding to the first area and a location corresponding to the second area may be identified on a subrack body 10 of the power distribution subrack.

Among a plurality of edge connectors distributed in the first area of the collection board 100, second ends of every three edge connectors are correspondingly connected to one controller, in other words, M=3. The first area is configured to be plug-connected to a first circuit breaker, and a width of the first circuit breaker is 30 mm, to distribute power to a load device or a power supply with a relatively large operating current. Circuit breakers plug-connected in the first area in the figure are a CB1 to a CB4.

Among a plurality of edge connectors distributed in the second area of the collection board 100, second ends of every two edge connectors are correspondingly connected to one controller, in other words, N=2. The second area is configured to be plug-connected to a second circuit breaker. A width of the second circuit breaker is 20 mm, to distribute power to a load device or a power supply with a relatively small operating current. Circuit breakers plug-connected in the second area in the figure are a CB5 to a CB7.

In this case, the circuit breakers CB1 to CB7 plug-connected on the power distribution subrack 1 may be tightly arranged, to fully utilize a width of the collection board and increase utilization of the controller. In addition, division is performed into the first area and the second area, so that when plug-connecting a circuit breaker, a user may plug-connect the circuit breaker to a corresponding area based on a correspondence between an area and a width of a circuit breaker, thereby standardizing a plug-connection operation and improving practicability of the power distribution subrack.

Figure 15:
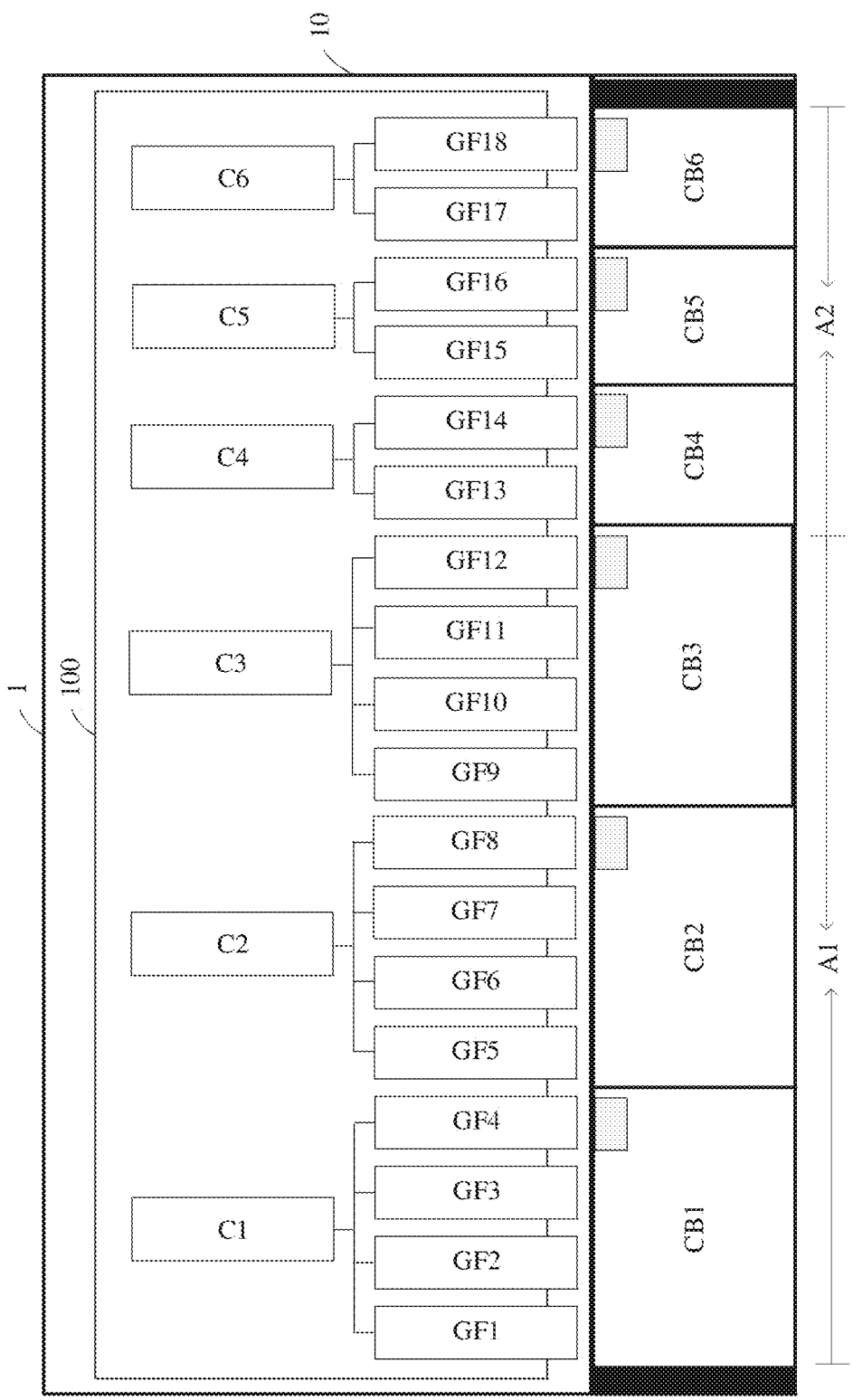
FIG. 15 is a schematic diagram of still yet another power distribution subrack according to an embodiment.

FIG. 15 is a schematic diagram of still yet another power distribution subrack according to an embodiment.

A collection board 100 includes at least one first area and at least one second area. In this embodiment, an example in which the collection board 100 includes one first area and one second area is used for description. An implementation in which a plurality of first areas and a plurality of second areas are included is similar. Details are no longer described herein.

A width of the first area corresponds to A1 in the figure, and a width of the second area corresponds to A2 in the figure. A location corresponding to the first area and a location corresponding to the second area may be identified on a subrack body 10 of the power distribution subrack.

Among a plurality of edge connectors distributed in the first area of the collection board 100, second ends of every four edge connectors are correspondingly connected to one controller, in other words, M=4. The first area is used to be plug-connected to a first circuit breaker, and the first circuit breaker is a circuit breaker with a width of 40 mm, to distribute power to a load device or a power supply with a relatively large operating current. Circuit breakers plug-connected in the first area in the figure are a CB1 to a CB3.

Among a plurality of edge connectors distributed in the second area of the collection board 100, second ends of every two edge connectors are correspondingly connected to one controller, in other words, N=2. The second area is configured to be plug-connected to a second circuit breaker, and the second circuit breaker is a circuit breaker with a width of 20 mm, to distribute power to a load device or a power supply with a relatively small operating current. Circuit breakers plug-connected in the second area in the figure are a CB4 to a CB6.

In this case, the circuit breakers CB1 to CB6 plug-connected on the power distribution subrack 1 may be tightly arranged, to fully utilize a width of the collection board and increase utilization of the controller. In addition, division is performed into the first area and the second area, so that when plug-connecting a circuit breaker, a user may plug-connect the circuit breaker to a corresponding area based on a correspondence between an area and a width of a circuit breaker, thereby standardizing a plug-connection operation and improving practicability of the power distribution subrack.

Figure 16:
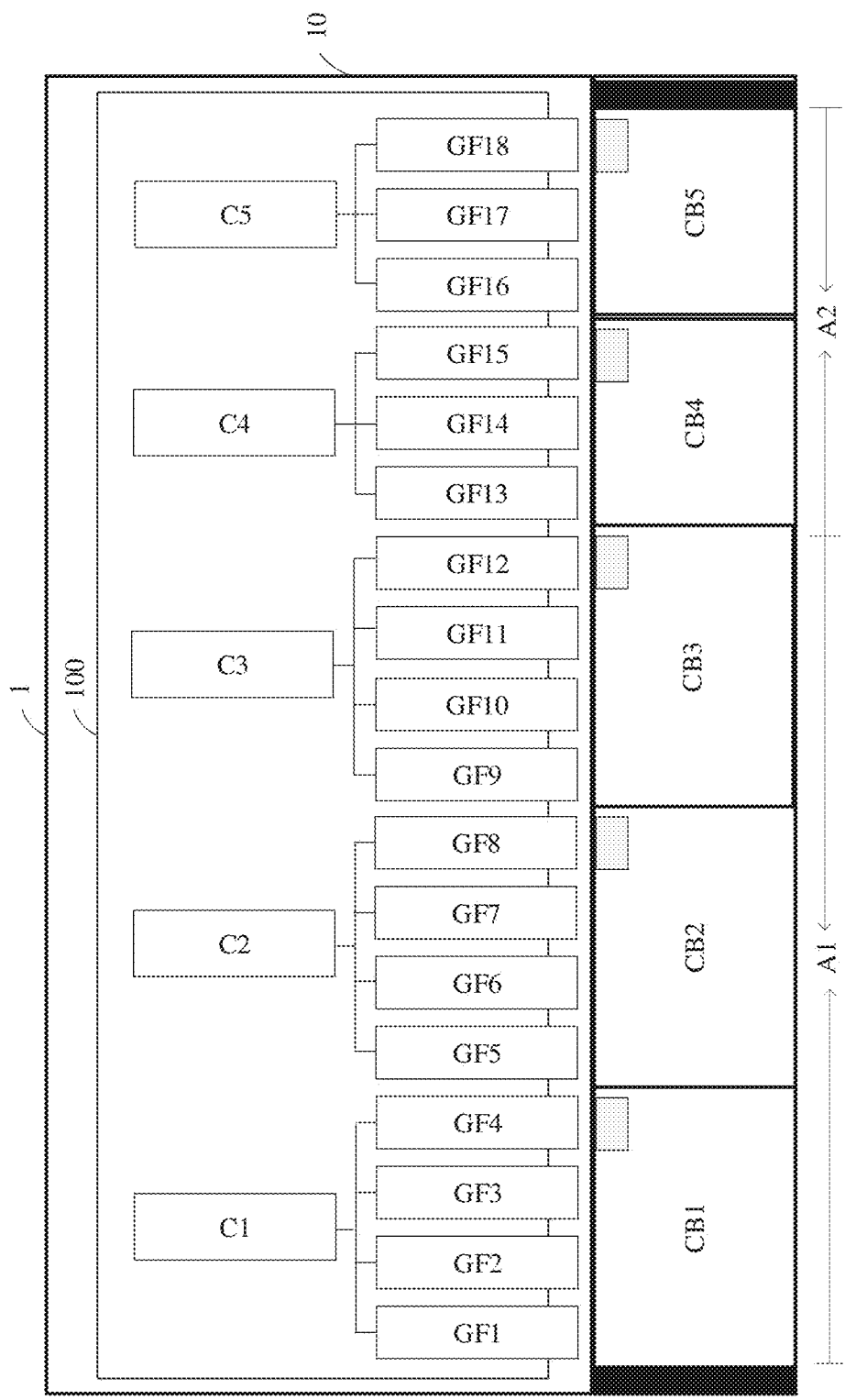
FIG. 16 is a schematic diagram of a further power distribution subrack according to an embodiment.

FIG. 16 is a schematic diagram of a further power distribution subrack according to an embodiment.

A collection board 100 includes at least one first area and at least one second area. In this embodiment, an example in which the collection board 100 includes one first area and one second area is used for description. An implementation in which a plurality of first areas and a plurality of second areas are included is similar. Details are no longer described herein.

A width of the first area corresponds to A1 in the figure, and a width of the second area corresponds to A2 in the figure. A location corresponding to the first area and a location corresponding to the second area may be identified on a subrack body 10 of the power distribution subrack.

Among a plurality of edge connectors distributed in the first area of the collection board 100, second ends of every four edge connectors are correspondingly connected to one controller, in other words, M=4. The first area is used to be plug-connected to a first circuit breaker, the first circuit breaker is a circuit breaker with a width of 40 mm, and circuit breakers plug-connected in the first area in the figure are a CB1 to a CB3.

Among a plurality of edge connectors distributed in the second area of the collection board 100, second ends of every three edge connectors are correspondingly connected to one controller, in other words, N=3. The second area is configured to be plug-connected to a second circuit breaker, the second circuit breaker is a circuit breaker with a width of 30 mm, and circuit breakers plug-connected in the second area in the figure are a CB4 to a CB5.

In this case, the circuit breakers CB1 to CB5 plug-connected on the power distribution subrack 1 may be tightly arranged, to fully utilize a width of the collection board and increase utilization of the controller. In addition, division is performed into the first area and the second area, so that when plug-connecting a circuit breaker, a user may plug-connect the circuit breaker to a corresponding area based on a correspondence between an area and a width of a circuit breaker, thereby standardizing a plug-connection operation and improving practicability of the power distribution subrack.

In addition, in some other embodiments, the collection board may further be divided into at least one first area, at least one second area, and at least one-third area, and each area is configured to be plug-connected to a circuit breaker with one width. For example, second ends of every two edge connectors in the first area are connected and are plug-connected to a circuit breaker with a width of 20 mm. Second ends of every three edge connectors in the second area are connected and are plug-connected to a circuit breaker with a width of 30 mm. Second ends of every four edge connectors in the third area are connected and are plug-connected to a circuit breaker with a width of 30 mm.

In some other implementations, the collection board may alternatively be divided into at least one first area, and the first area is configured to be plug-connected to at least one first circuit breaker; or the collection board may alternatively be divided into at least one second area, and the second area is configured to be plug-connected to at least one second circuit breaker. Details are no longer described herein in this embodiment.

Thus, based on the solution provided in this embodiment, at least two connection terminals share one controller, so that a quantity of controllers disposed on the collection board is reduced at least by half, controllers in an idle state are reduced, and utilization of the controllers is increased. In addition, a quantity of controllers disposed on the collection board is reduced, thereby further reducing space that is on the collection board and that is occupied by the controller and reducing material costs of the collection board. In addition, the collection board of the power distribution subrack is divided into different areas to be plug-connected to circuit breakers with different widths, so that the space of the collection board can be fully utilized. In addition, utilization of the controllers is increased, a plug-connection operation is standardized, and practicability of the power distribution subrack is improved.

Based on the power distribution subrack provided in the foregoing embodiment, an embodiment further provides power distribution equipment. Details are described below with reference to the accompanying drawing.

Figure 17:
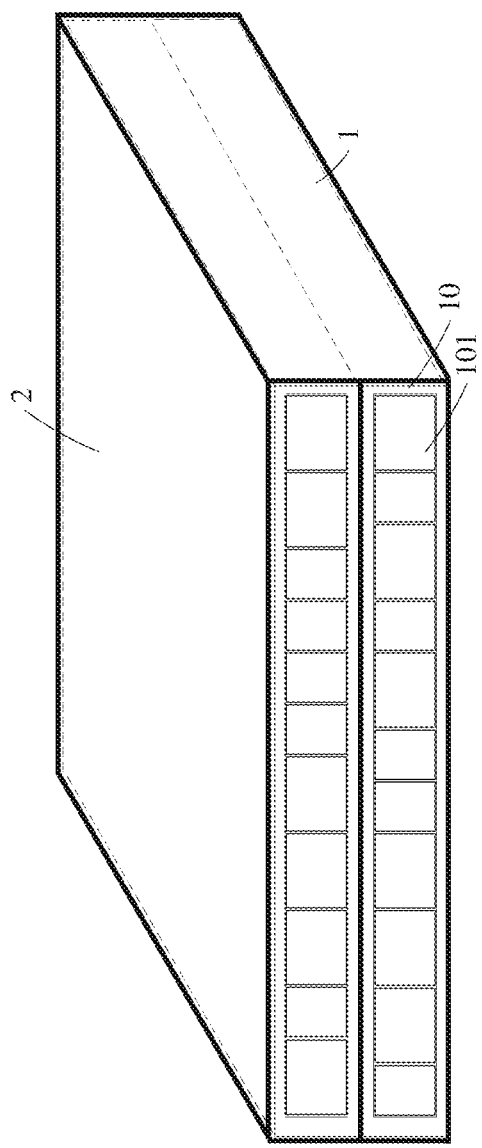
FIG. 17 is a schematic diagram of power distribution equipment according to an embodiment.

FIG. 17 is a schematic diagram of power distribution equipment according to an embodiment.

The power distribution equipment 2 shown in the figure includes at least one power distribution subrack 1 and at least one circuit breaker 101.

The circuit breaker 101 is plug-connected on the power distribution subrack 1.

The power distribution subrack 1 includes a subrack body 10 and a collection board, and the collection board is disposed inside the subrack body 10 (not shown in the figure).

In some embodiments, the power distribution subrack 1 may be plug-connected to a plurality of circuit breakers, and the plurality of circuit breakers include circuit breakers with different widths, for example, include a circuit breaker with a width of 30 mm and a circuit breaker with a width of 20 mm. A larger width of a circuit breaker leads to a larger operating current. A specific quantity of circuit breakers is not limited in this embodiment.

For a specific implementation of the power distribution subrack 1, refer to related descriptions in the foregoing embodiment. Details are no longer described herein in this embodiment.

The power distribution equipment may be used in a power supply of a base station, for example, power distribution equipment of a 5G base station. In some embodiments, the power distribution equipment is an intelligent power supply. The power distribution device controls power-on or power-off of a load device and a power supply by using a circuit breaker. Types of and a quantity of load devices are not limited in this embodiment. For example, the load device may be a temperature control device, such as an air conditioner or a fan. Alternatively, the load device may be an RRU or a BBU.

Therefore, in the solution provided in this embodiment, at least two connection terminals share one controller, so that a quantity of controllers disposed on the collection board of the power distribution subrack is reduced by half, thereby reducing controllers in an idle state, increasing utilization of controllers, further reducing space that is on the collection board and that is occupied by the controller, and reducing material costs of the collection board. In addition, the collection board of the power distribution subrack further supports a mixed plug-connection between circuit breakers with different widths in any sequence, thereby improving convenience.

In the foregoing embodiments, the example in which the width of the circuit breaker is 20 mm, 30 mm, or 40 mm is used for description. During actual application, a circuit breaker with a width of another specification may further be used. This is not limited herein.

It should be understood that "at least one (item)" refers to one or more and "a plurality of" refers to two or more. The term "and/or" is used for describing an association relationship between associated objects, and represents that three relationships may exist. For example, "A and/or B" may represent the following three cases: only A exists, only B exists, and both A and B exist, where A and B may be singular or plural. The character "/" generally indicates an "or" relationship between the associated objects.

The foregoing embodiments are merely intended for describing the solutions and not for limiting the embodiments. Although described in detail with reference to the foregoing embodiments, a person of ordinary skill in the art should understand that they may still make modifications to the solutions described in the foregoing embodiments or make equivalent replacements to some features thereof, without departing from the spirit and scope of the solutions of the embodiments.

What is claimed is:
1. A power distribution subrack, comprising:
a subrack body and a collection board, the collection board is disposed inside the subrack body, and the collection board comprises a plurality of connection terminals and a plurality of controllers;
second ends of at least two of the plurality of connection terminals are connected to a same controller;

first ends of at least some of the plurality of connection terminals are plug-connected to jacks of one or more circuit breakers, and the at least some connection terminals are in a one-to-one correspondence with the one or more circuit breakers;

each of the at least some connection terminals is configured to obtain a status signal of a corresponding circuit breaker and transmit the status signal to a corresponding controller; and the controller is configured to send, based on the status signal and by using the corresponding connection terminal, a control signal to the circuit breaker corresponding to the status signal, wherein the control signal is used to control connection and disconnection of the circuit breaker corresponding to the status signal.

2. The power distribution subrack according to claim 1, wherein a plurality of pins comprised in each of the connection terminals are respectively configured to transmit different types of signals, wherein the different types of signals comprise the control signal, and at least one of the following types of status signals: a circuit breaker in-position signal, a voltage sampling signal, a current sampling signal, a temperature sampling signal, and an indicator status signal of a circuit breaker; and in the at least two connection terminals connected to the same controller, pins located in each connection terminal and configured to transmit a same type of signals are connected.

3. The power distribution subrack according to claim 1, wherein the plurality of connection terminals comprise a plurality of groups of connection terminals, each of the plurality of groups of connection terminals comprises at least two connection terminals, and second ends of the at least two connection terminals comprised in each of the plurality of groups of connection terminals are connected to a same controller.

4. The power distribution subrack according to claim 3, wherein each of the plurality of groups of connection terminals comprises two connection terminals, and second ends of the two connection terminals comprised in each of the plurality of groups of connection terminals are connected to a same controller.

5. The power distribution subrack according to claim 3, wherein each of the plurality of groups of connection terminals comprises three connection terminals, and second ends of the three connection terminals comprised in each of the plurality of groups of connection terminals are connected to a same controller.

6. The power distribution subrack according to claim 1, wherein the collection board comprises at least one first area, and, among a plurality of connection terminals distributed in the at least one first area, second ends of every M connection terminals are connected to a same controller, wherein M is an integer greater than or equal to 2.

7. The power distribution subrack according to claim 6, wherein the collection board further comprises at least one second area, and, among a plurality of connection terminals distributed in the at least one second area, second ends of every N connection terminals are connected to a same controller, wherein N is an integer greater than or equal to 2, and M is unequal to N.

8. The power distribution subrack according to claim 7, wherein M is greater than N, at least some connection terminals in the at least one first area are configured to be plug-connected to at least one first circuit breaker, and at least some connection terminals in the at least one second area are configured to be plug-connected to at least one second circuit breaker; and an operating current of a power supply or a load device connected to the at least one first circuit breaker is greater than an operating current of a power supply or a load device connected to the at least one second circuit breaker.

9. The power distribution subrack according to claim 8, wherein the load device comprises at least one of:
a fan, an air conditioner, a remote radio unit (RRU), and a baseband processing unit (BBU).

10. The power distribution subrack according to claim 1, wherein the collection board further comprises a plurality of first resistors; and a second end of each of the connection terminals is connected to one of the plurality of controllers by using at least one of the plurality of first resistors.

11. The power distribution subrack according to claim 1, wherein the collection board further comprises a plurality of second resistors; and after the second ends of the at least two connection terminals are connected, the second ends are connected to one of the plurality of controllers by using at least one of the plurality of second resistors.

12. The power distribution subrack according to claim 1, wherein the connection terminal is an edge connector.

13. The power distribution subrack according to claim 1, wherein the jack that is of the circuit breaker and that is for being plug-connected on the power distribution subrack is a socket of an interconnection wiring terminal, the socket of the interconnection wiring terminal has space for accommodating a connector of the interconnection wiring terminal, and the connection terminal is the connector of the interconnection wiring terminal.

14. The power distribution subrack according to claim 2, wherein the plurality of connection terminals comprise a plurality of groups of connection terminals, each of the plurality of groups of connection terminals comprises at least two connection terminals, and second ends of the at least two connection terminals comprised in each of the plurality of groups of connection terminals are connected to a same controller.

15. The power distribution subrack according to claim 2, wherein the collection board comprises at least one first area, and among a plurality of connection terminals distributed in the at least one first area, second ends of every M connection terminals are connected to a same controller, wherein M is an integer greater than or equal to 2.

16. Power distribution equipment, comprising:
at least one power distribution subrack and at least one circuit breaker;
the at least one circuit breaker is plug-connected on the power distribution subrack; and
the at least one circuit breaker is configured to control power-on or power-off of a load device or a power supply connected to the power distribution equipment;
wherein the power distribution subrack comprises a subrack body and a collection board, the collection board is disposed inside the subrack body, and the collection board comprises a plurality of connection terminals and a plurality of controllers;
second ends of at least two of the plurality of connection terminals are connected to a same controller;
first ends of at least some of the plurality of connection terminals are plug-connected to jacks of one or more circuit breakers, and the at least some connection terminals are in a one-to-one correspondence with the one or more circuit breakers;

each of the at least some connection terminals is configured to: obtain a status signal of a corresponding circuit breaker, and transmit the status signal to a corresponding controller; and the controller is configured to send, based on the status signal and by using the corresponding connection terminal, a control signal to the circuit breaker corresponding to the status signal, wherein the control signal is used to control connection and disconnection of the circuit breaker corresponding to the status signal.

17. The power distribution equipment according to claim 16, wherein the power distribution subrack comprises at least two circuit breakers; and the at least two circuit breakers comprise at least one first circuit breaker and at least one second circuit breaker, and an operating current of a power supply or a load device connected to the at least one first circuit breaker is greater than an operating current of a power supply or a load device connected to the at least one second circuit breaker.

* * * * *